United States Patent [19]
Kim

[11] Patent Number: 5,977,584
[45] Date of Patent: *Nov. 2, 1999

[54] MEMORY DEVICES CONTAINING DUAL-STRING NOR MEMORY ARRAYS THEREIN

[75] Inventor: Keon-Soo Kim, Kyungki-do, Rep. of Korea

[73] Assignee: Samsung Electronics Co., Ltd., Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/685,458

[22] Filed: Jul. 19, 1996

[30] Foreign Application Priority Data

Jul. 20, 1995 [KR] Rep. of Korea ...................... 95-21401

[51] Int. Cl.$^6$ ...................... H01L 29/788; H01L 27/108; H01L 29/76; H01L 29/94
[52] U.S. Cl. ........................... 257/315; 257/296; 257/326
[58] Field of Search .................................. 257/296, 315, 257/321, 326

[56] References Cited

U.S. PATENT DOCUMENTS

| | | | |
|---|---|---|---|
| 5,610,419 | 3/1997 | Tanaka ..................................... | 257/315 |
| 5,610,420 | 3/1997 | Kuroda et al. ........................... | 257/315 |
| 5,687,121 | 11/1997 | Lee et al. ............................. | 365/185.11 |
| 5,748,538 | 5/1998 | Lee et al. ............................. | 365/185.06 |

OTHER PUBLICATIONS

Kim, K.S. et al., "A Novel Dual String NOR (DuSNOR) Memory Cell Technology Scalable to the 256 Mbit and 1 Gbit Flash Memories", IEEE/IEDM 95, pp. 263–266, Dec. 1995.

Kume et al., "A 1.28 $\mu m^2$ Contactless Memory Cell Technology for a 3V–Only 64Mbit EEPROM" IEDM Technical Digest, International Electron Devices Meeting 1992, Dec. 13–16, 1992, pp. 991–993.

Kato et al., "A 0.4—$\mu m^2$ Self–Aligned Contactless Memory Cell Technology Suitable for 256–Mbit Flash Memories", IEDM Technical Digest, 1994, pp. 921–923.

Kobayashi et al., "Memory Array Architecture and Decoding Scheme for 3V Only Sector Erasable DINOR Flash Memory", IEEE Journal of Solid State Circuits, vol. 29, No. 3, Apr. 1994, pp. 454–458.

Kobayashi et al., "Memory Array Architecture and Decoding Scheme for 3V Only Sector Erasable DINOR Flash Memory", VLSI Circuits 1993, 1993, pp. 97–98.

Tam et al., "A High Density CMOS 1–T Electrically Erasable Non–Volatile (Flash) Memory Technology", VLSI Technology, 1988, IV–4, pp. 31–32.

(List continued on next page.)

*Primary Examiner*—Olik Chaudhuri
*Assistant Examiner*—Howard Weiss
*Attorney, Agent, or Firm*—Myers Bigel Sibley & Sajovec

[57] ABSTRACT

A nonvolatile memory circuit is formed on a substrate. Spaced apart first, second and third source/drain regions are formed in the substrate, the third source/drain region disposed between the first and second source/drain regions, the first, second and third source/drain regions having a generally elongate shape. A first row of floating gate electrodes are formed on the substrate, disposed between the first and third source/drain regions. A second row of floating gate electrodes is formed on the substrate, disposed between the second and third source/drain regions. A plurality of insulated word lines is formed on the substrate, a respective one of the insulated word lines overlying a respective one of the first row of floating gate electrodes and a respective one of the second row of floating gate electrodes and running in a direction transverse to the first, second and third source/drain regions. A plurality of channel stop regions may be formed in the substrate, a respective one of the plurality of channel stop regions being disposed between a respective pair of floating gate electrodes in a respective one of the first and second rows of floating gate electrodes.

14 Claims, 39 Drawing Sheets

OTHER PUBLICATIONS

Onoda et al., "A Novel Cell Structure Suitable for a 3 Volt Operation, Sector Erase Flash Memory", IEDM 92, pp. 599–602.

Verma et al., "Reliability Performance of Etox Based Flash Memory", IEEE/IRPS, 1988, pp. 158–166.

Mukherjee et al., "A Single Transistor EEPROM Cell and Its Implementation in a 512K CMOS EEPROM", IEDM 85, pp. 616–619.

Hisamune et al., High Capacitive–Coupling Ratio (HiCR) Cell for 3 V–Only 64 Mbit and Future Flash Memories, 1993 IEEE, IEDM 93, 2.3.1–2.3.4, pp. 19–22.

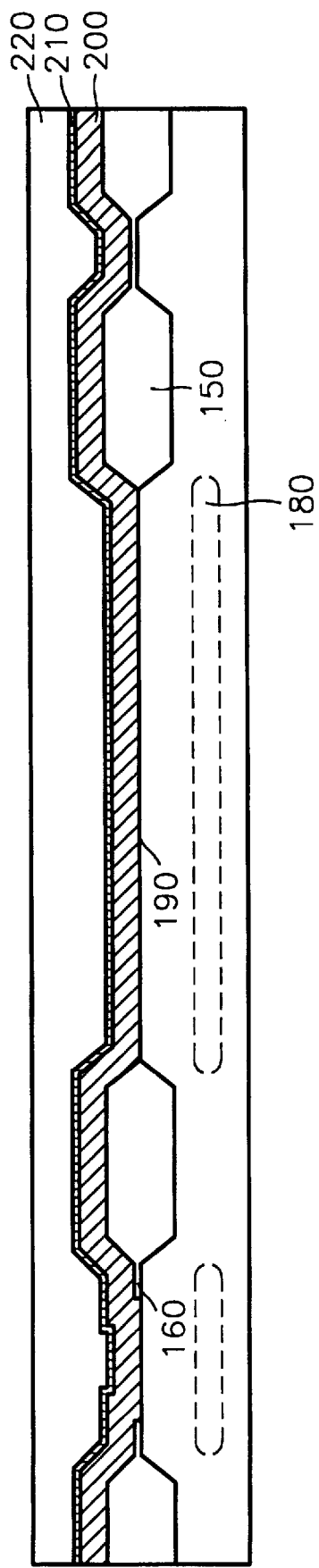
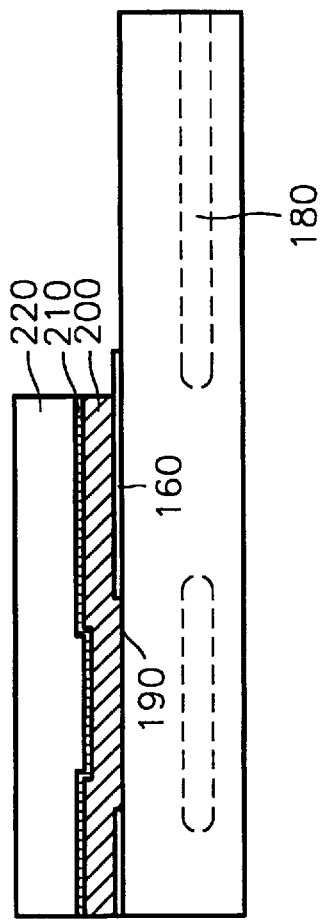

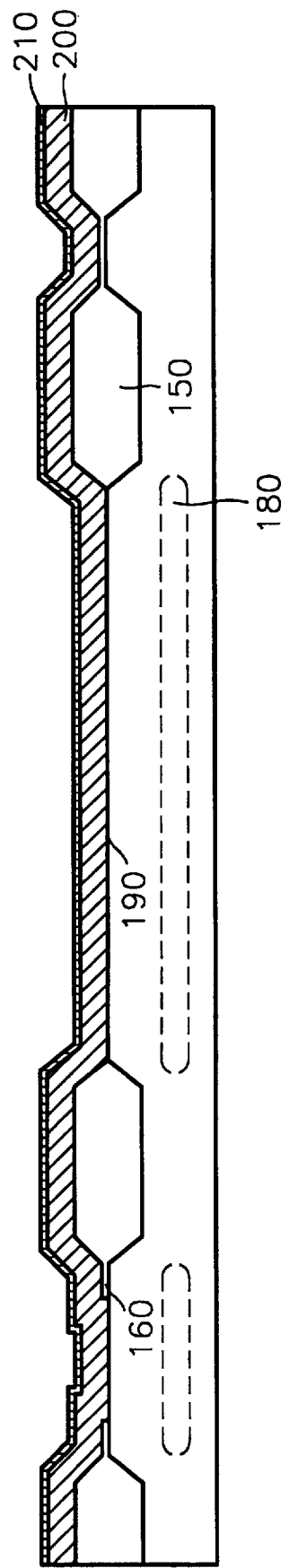
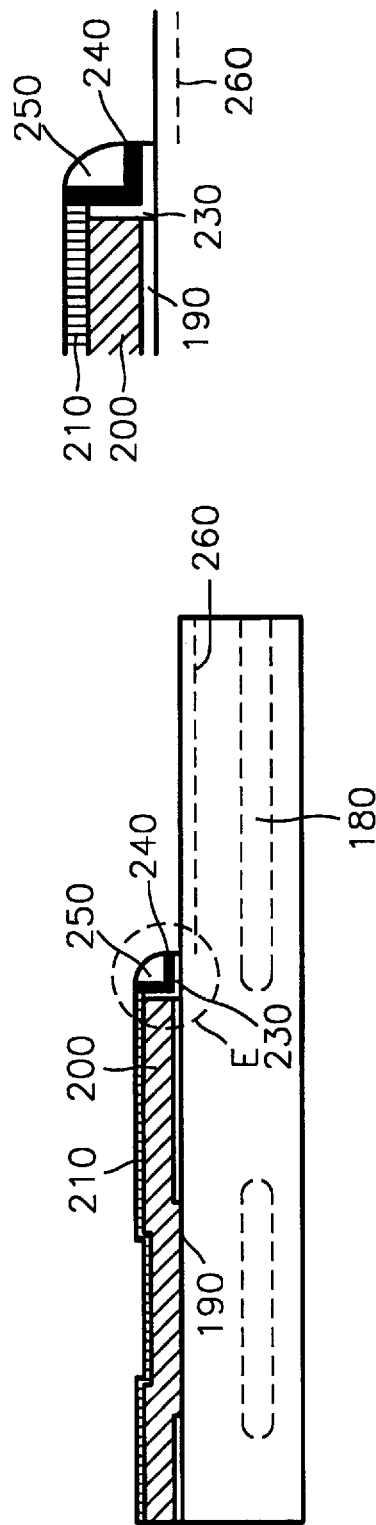

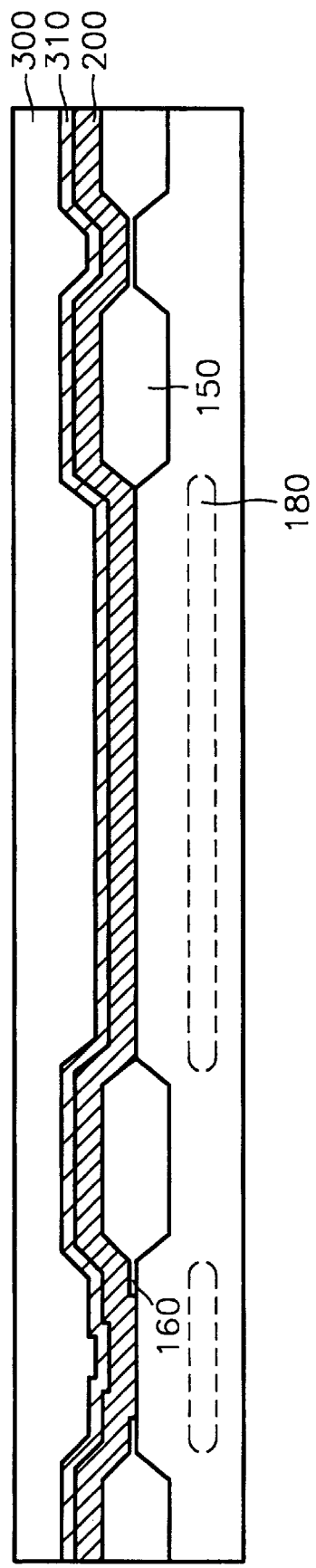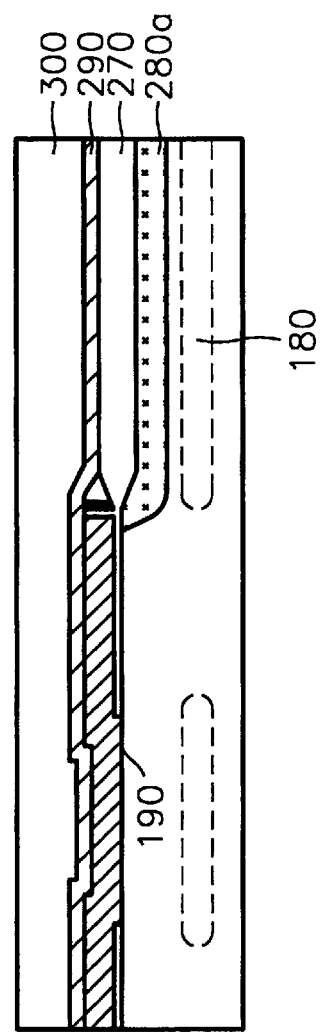

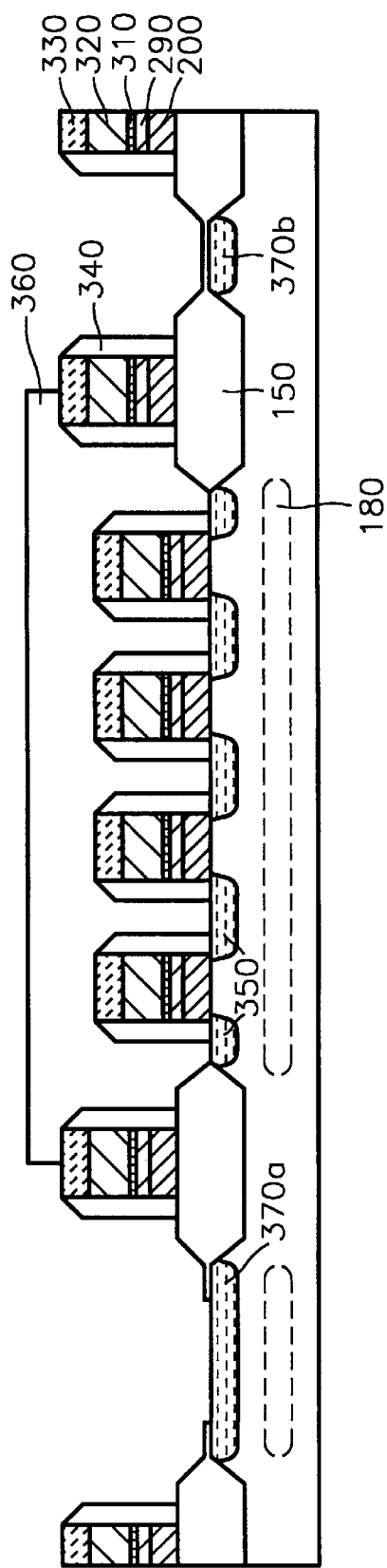
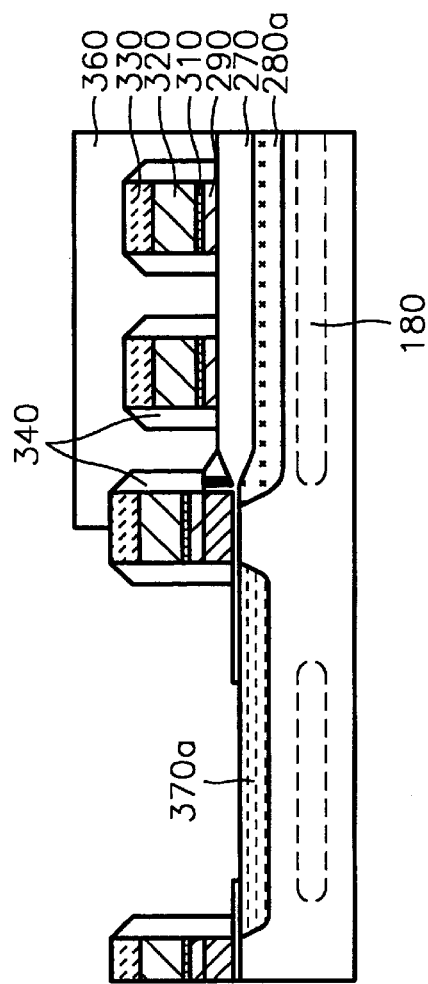
FIG. 8J
FIG. 9J

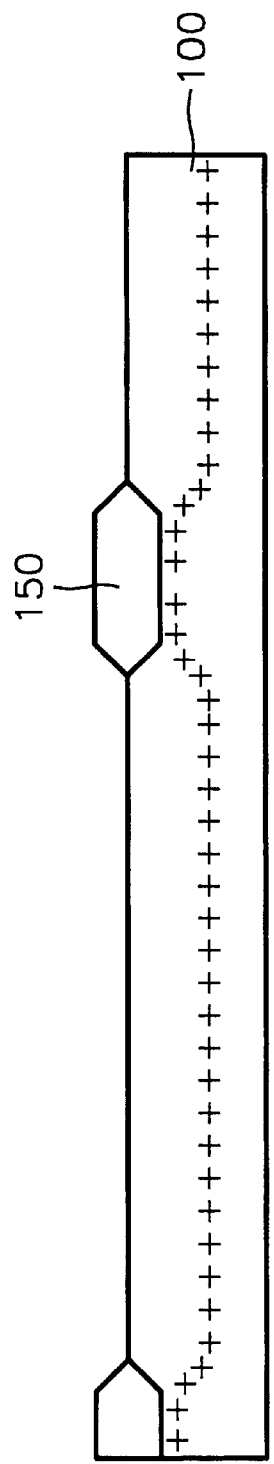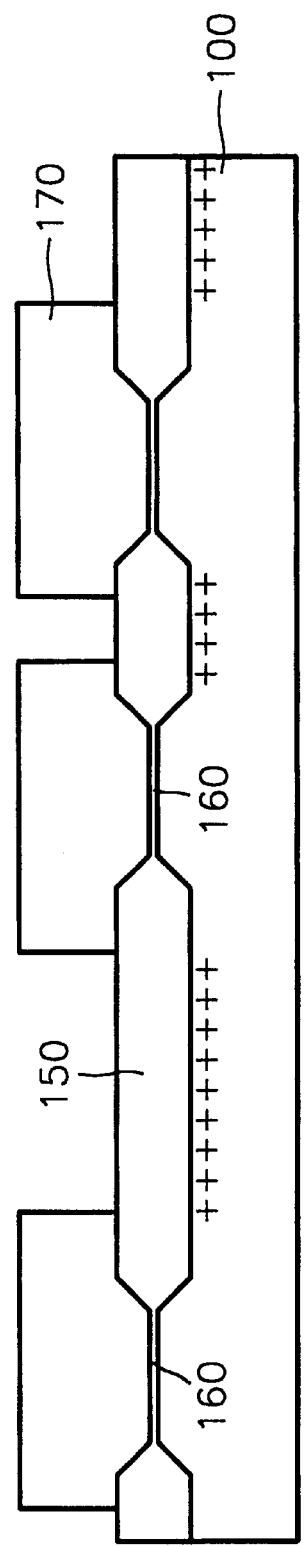

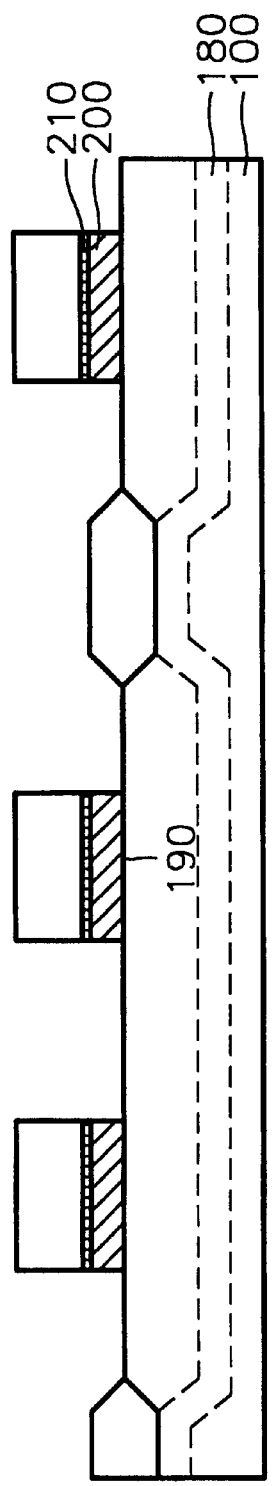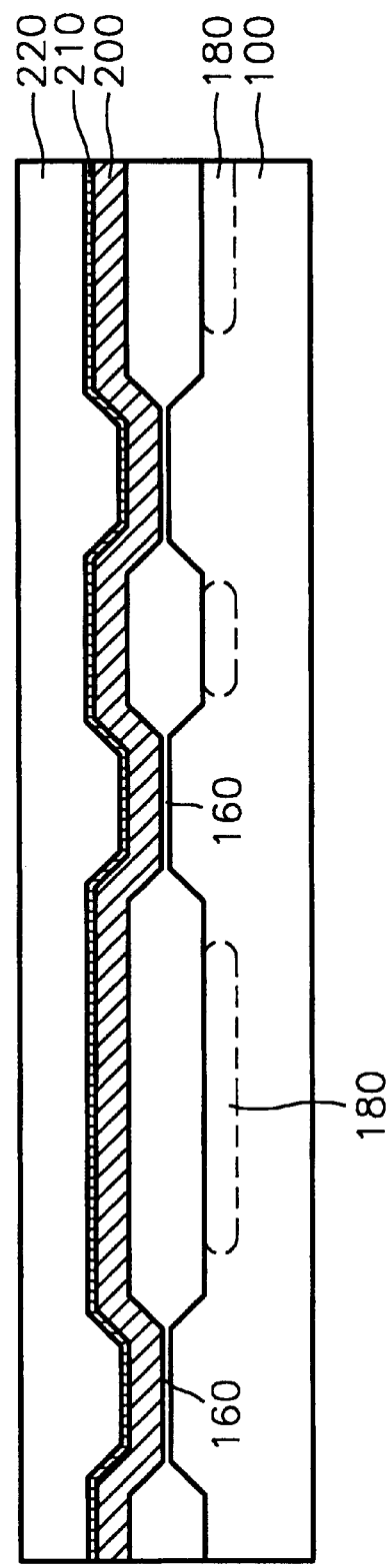

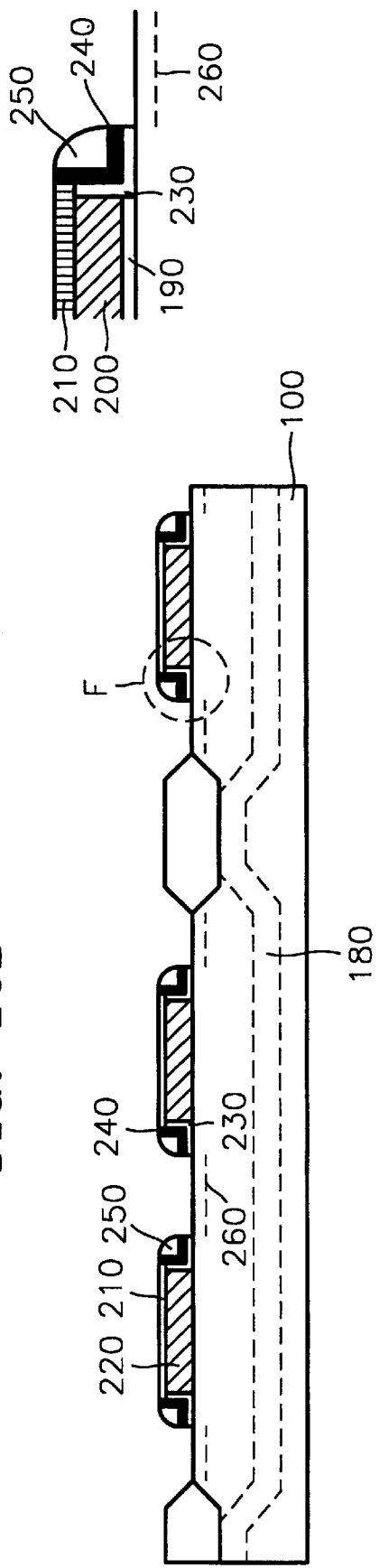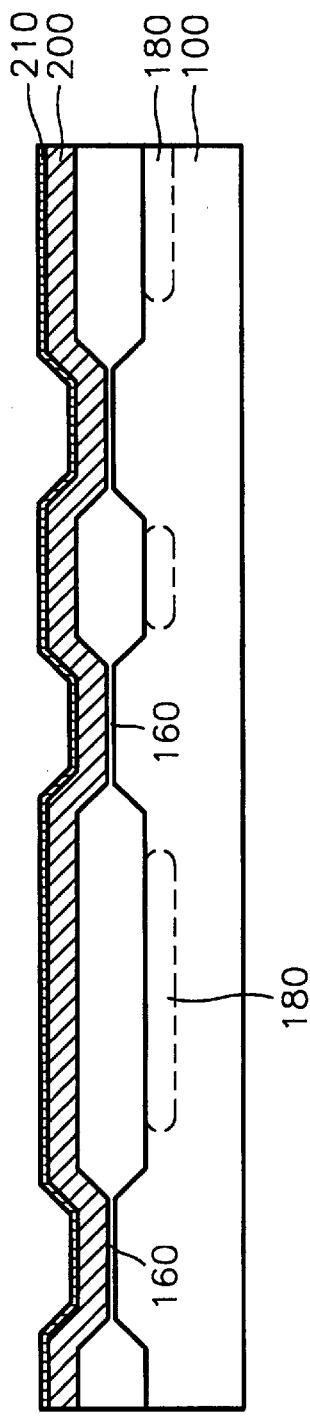

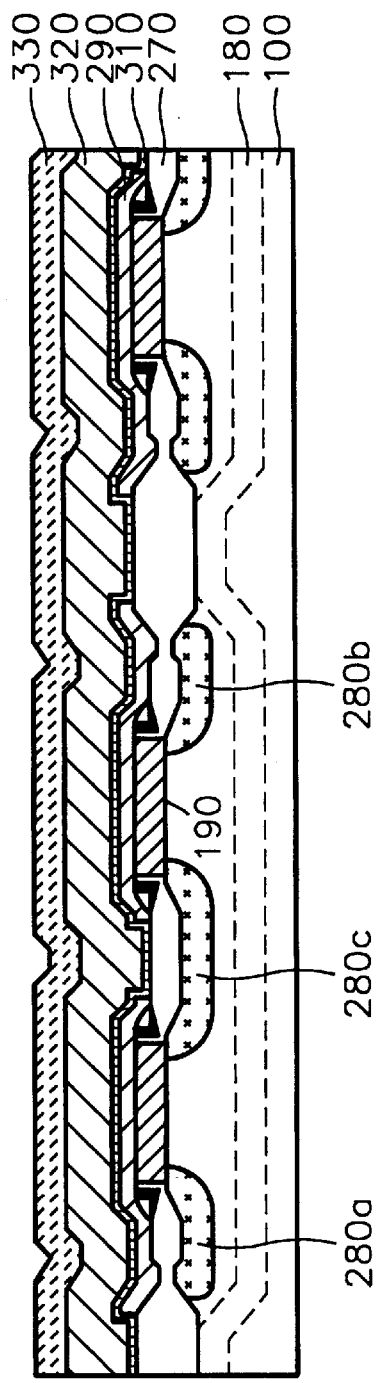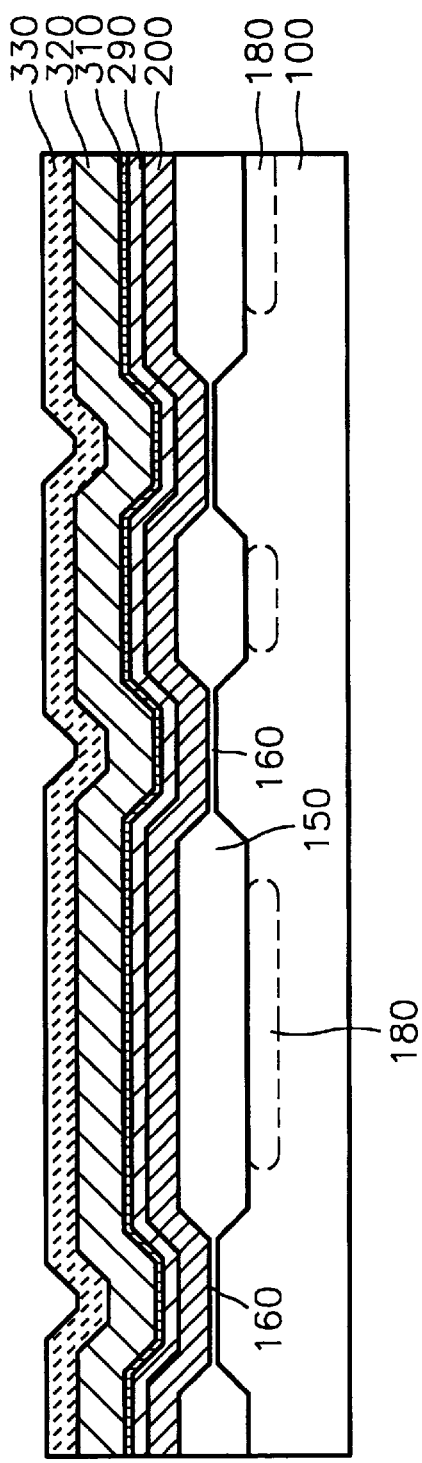

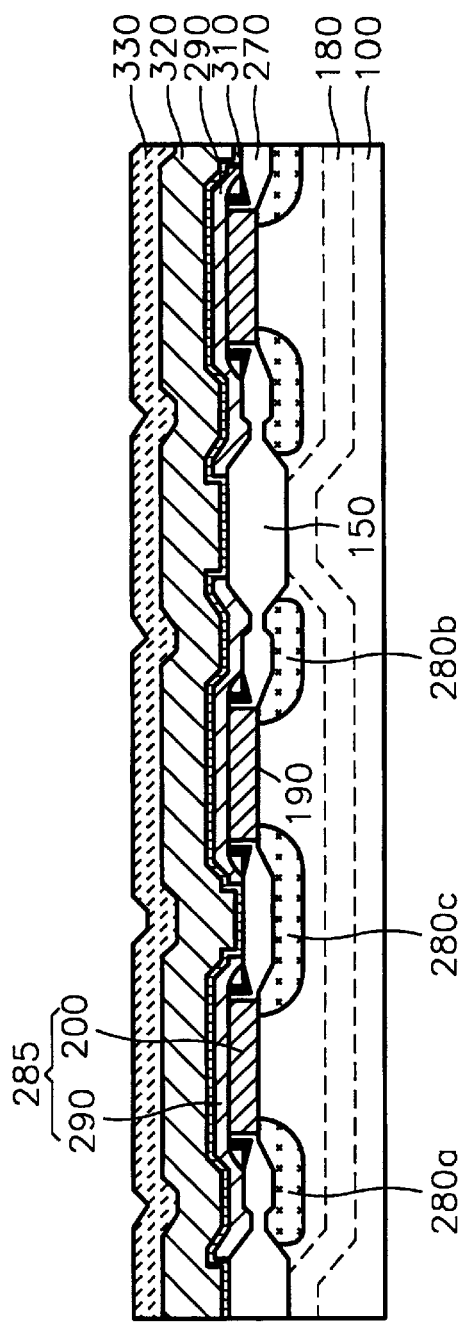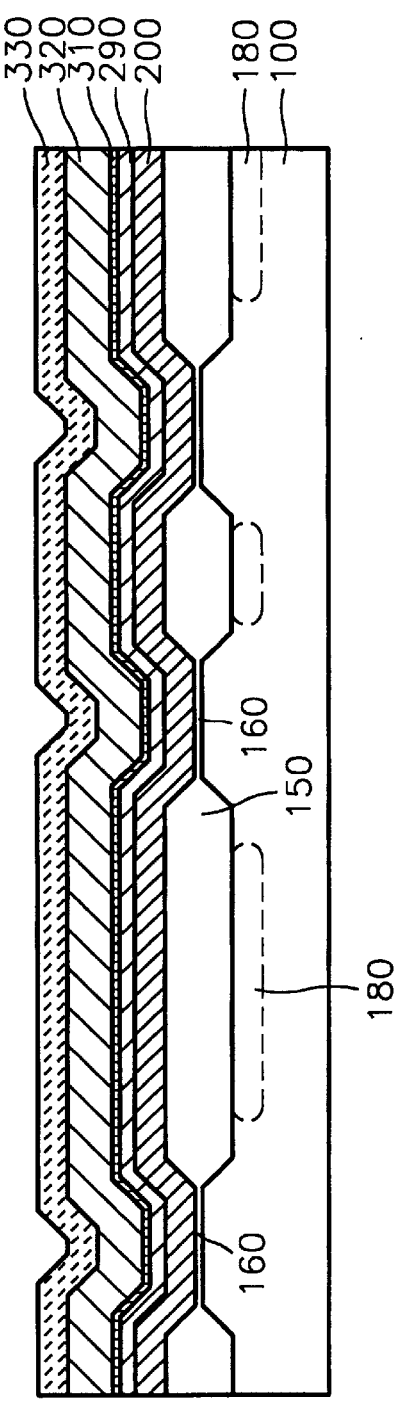

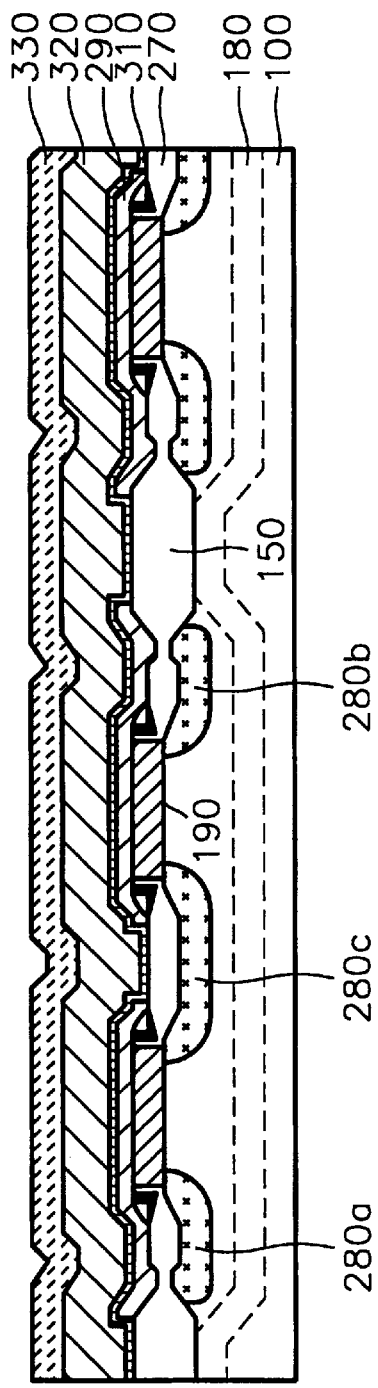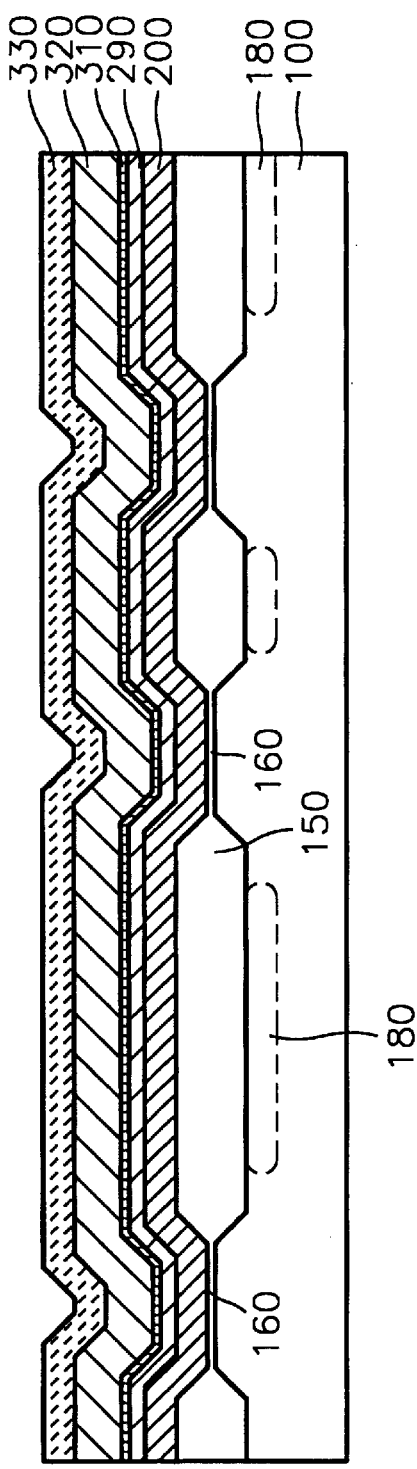

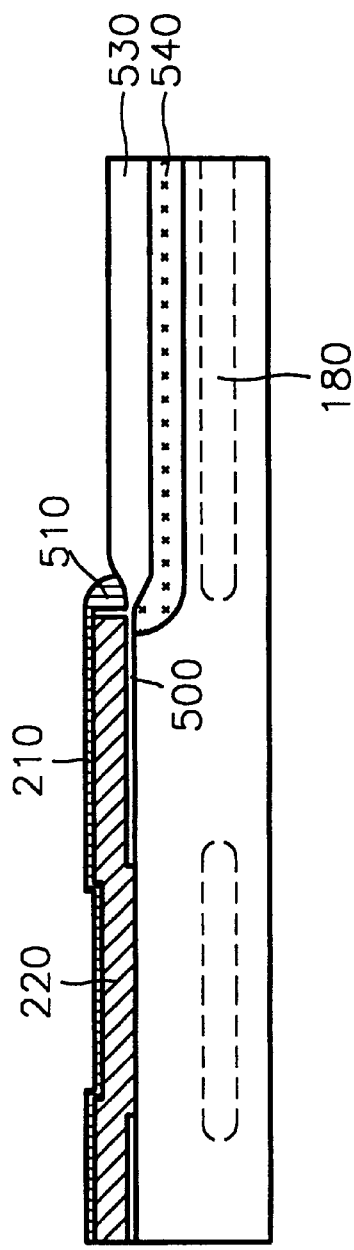
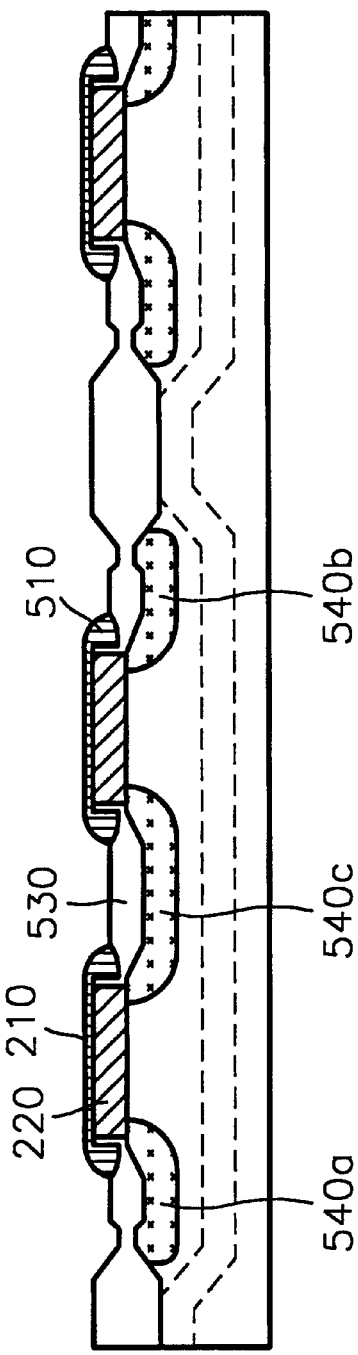

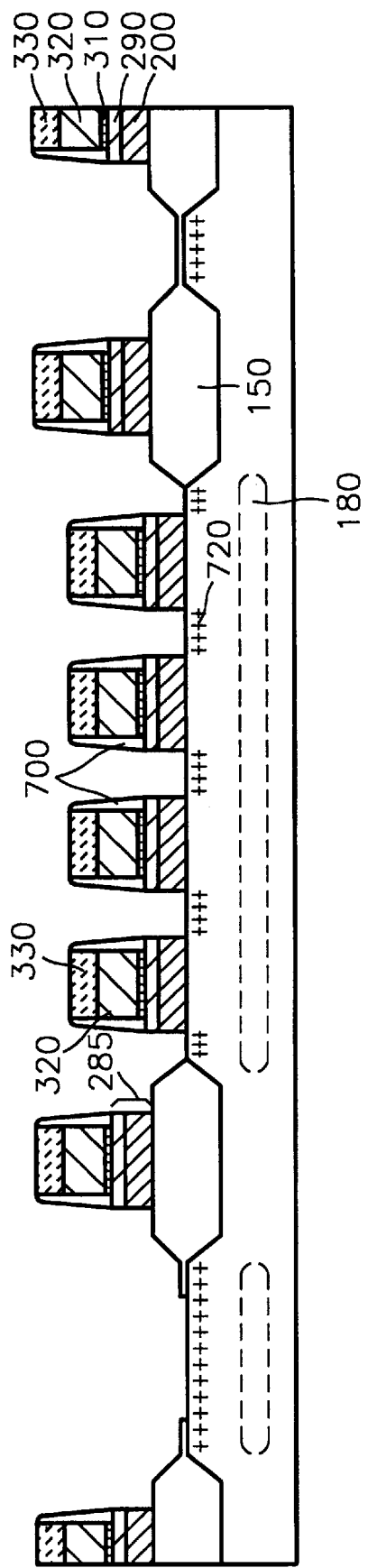
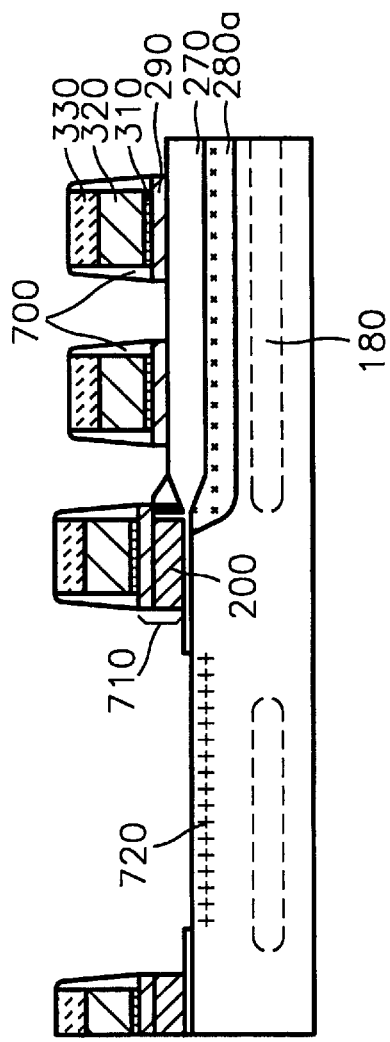
FIG. 19B
FIG. 20B

MEMORY DEVICES CONTAINING DUAL-STRING NOR MEMORY ARRAYS THEREIN

FIELD OF THE INVENTION

The present invention relates to integrated circuits and methods of fabrication therefor, in particular, to nonvolatile memory circuits and methods of fabrication therefor.

BACKGROUND OF THE INVENTION

As is well-known to those skilled in the art, integrated circuit memory devices include random access memory (RAM) devices, which generally do not retain stored information when power is interrupted, and read only memory (ROM) devices, which generally retain their stored information despite power failure. For this reason, the latter devices art often referred to as nonvolatile memory devices. Nonvolatile memory devices include "flash" electrically-erasable programmable read only memory (EEPROM) devices, which may be electrically erased and programmed. Flash EEPROMs are widely used for computers, memory cards, and the like.

Conventional flash EEPROMs may utilize various kinds of memory cells. The conventional cell structures used include simple stack-gate cells, as described in Tam et al., "A High Density CMOS 1-T Electrically Eraseable Non-Volatile (Flash) Memory Technology," VLSI Technology, 1988, IV-4, pp. 31-32. A stack-gate cell typically includes a transistor having source and drain regions, and a gate including a floating gate electrode and control gate electrode, with the floating gate serving to store data and the control gate serving to control the data stored by the floating gate. Typically, an erase operation lowers the threshold voltage of the stack-gate cell by tunneling electrons from the floating gate electrode to the source and drain regions, while a program operation increases the threshold voltage of the cell by injecting hot electrons generated in a channel region between the source and drain regions into the floating gate electrode using potentials at the gate electrode and drain regions that are higher than a potential supplied to the source region. A read operation reads the state of the cell.

The simple stack-gate cell has several disadvantages in its structure and operations. As programming is typically performed by hot electron injection, the cycling endurance of the erase/program operations may be sharply lowered, which may degrade cell performance. Non-selected cells may be disturbed during program or read operations, and cells may become over-erased, i.e., may be put into a state in which they have a threshold voltage lower than 0 V.

Stacked-gate cells typically have structural features which may complicate fabrication. Although only one single transistor may be used for each cell, a bit line may be required for every two cells. Also, since the source regions of cells typically are commonly connected in an active region, a corner rounding phenomenon may occur during oxidation to form a field oxide layer, thereby increasing the threshold voltage dissipation of the cell after erase and program operations.

A DINOR (DIvided bit line NOR) cell has been proposed to avoid some of the problems associated with the stack-gate cell, as described Kobayashi et al., "Memory Array Architecture and Decoding Scheme for 3 V Only Sector Eraseable DINOR Flash Memory," VLSI Circuits, 1993, pp. 97-98. FIGS. 1 and 2 are a schematic diagram and a cross-sectional view of a conventional flash EEPROM utilizing a DINOR cell, respectively. The DINOR cell includes word lines WL1 through WLi for selecting a desired cell transistor, a select transistor line 3 having select transistors 3a, main bit lines 1 connected to the drain of a select transistor 3a, and sub bit lines 5 connected to the source of the select transistor 3a, typically formed as a polysilicon layer. A DINOR cell typically has a string-like structure wherein adjacent cell transistors are connected in parallel through the sub bit lines 5 connected to the drains of the transistors and source line 7 connected to the sources of the adjacent transistors. As illustrated in FIG. 1, a unit block A includes a select transistor 3a, eight memory cells, and one sub bit line 5 connected to main bit line 1 through the select transistor 3a.

To erase a cell, approximately 10 V is applied to a word line W/L1, and approximately 8 V is applied to source line 7 and the p-well or substrate upon which the cell is formed, thereby causing tunneling of electrons from the well or substrate to the floating gate electrode and increasing the threshold voltage to approximately 6–7 V. Programming may be achieved by applying a negative voltage of about −8 V to the word line W/L1 and applying approximately 5 V to a bit line 1, thereby tunneling electrons from the floating gate electrode to the drain of the cell and decreasing the threshold voltage. Fabrication of DINOR cells typically is complex, involving a large number of process steps. Typically, a self-aligned source, a self-aligned bitline contact and a tungsten plug must be fabricated in addition to the basic structures of the stack-gate cell. In forming the self-aligned bit line contact and sub bit lines, a stringer may be generated, thus reducing yields. Also, during etching of a thick field oxide layer to form the self-aligned source, the surface of the silicon substrate may be damaged, thereby degrading the cell characteristics due to leakage current. In addition, as the sources of cells are commonly connected in the direction of adjacent word lines, the resistance of the source line generally is increased and an extra circuit for decoding the source may be necessary, complicating the design and increasing the size of the row decoder.

An AND cell has been proposed as an alternative to the stack-gate cell, as described in IEDM, pp. 991-993, 1992 and IEDM, pp. 921-923, 1994. As illustrated in FIG. 3, a unit block B includes a plurality of memory cells connected in parallel, a local data line 11 for connecting the drains of the memory cells, a local source line 13 for connecting the sources of the memory cells, data and source select transistors ST1, ST2 for selecting the local data lines 11 and the local source lines 13, global data lines 15 (D0–Dn) connected to the data select transistors ST1, and a common source line 17 connected to the source select transistor ST2.

To erase a cell, approximately 0 V is applied to the source and drain of the cell, as well as to the well or substrate upon which the cell is formed. Approximately 13 V is applied to the associated word line, thereby tunneling electrons from the well or substrate to the floating gate electrode and increasing the threshold voltage of the cell to approximately 6–7 V. Programming is achieved by applying a voltage of approximately −9 V to the word line and applying approximately 3 V to the drain of the cell, thereby tunneling electrons from the floating gate to the drain and decreasing the threshold voltage of the cell to approximately 1–2 V.

The local source line 13 and local data line 11 typically are doped $n^+$-diffusion layers. This may simplify fabrication in comparison to a DINOR structure, in that the space and processes used for forming bit lines may be eliminated. As illustrated in FIGS. 4A-4B, the floating gate 19 typically is composed of a double stack of polysilicon layers, underlying word line 19 and insulation layer 21. Isolation between channels of the cell is achieved by using a self-aligned junction layer 25 formed by ion implantation. The parallel structure in the direction of the global data lines 15 can help increase density, but two source/drain regions 23a, 23b, typically diffusion layers, as well as a field insulation layer 27 typically lie between adjacent floating gate electrodes 16. This may limit the density which may be achieved, as reducing the size of the source/drain regions 23a, 23b tends to increase resistance and degrade cell performance.

SUMMARY OF THE INVENTION

In light of the foregoing, it is an object of the present invention to provide nonvolatile memory circuits capable of increased integration density while maintaining circuit stability, and fabrication methods therefor.

This and other objects, features and advantages are provided according to the present invention by nonvolatile memory circuits which utilize a dual-string NOR cell structure including first and second adjacent rows of parallel-connected floating gate transistors, wherein first source/drain electrodes of transistors are commonly connected in each row, wherein second source/drain electrodes of transistors in both rows are commonly connected, and wherein the control gate electrode of a respective transistor of the first row of transistors is connected to the control gate electrode of a respective transistor of the second row of transistors. This circuit may be fabricated as a compact structure including three spaced apart elongate source/drain regions in a substrate, first and second rows of floating gate electrodes on the substrate between the source/drain regions, and a plurality of insulated word lines overlying respective floating gate electrodes in the first and second rows of floating gate electrodes. Select transistors for drain and source lines may be formed adjacent the first, second and third source/drain regions. Preferably, the memory block so formed is isolated using a surrounding field oxide region and an underlying impurity region formed by an ion implantation. The present invention thus utilizes a parallel structure for drain and source lines which can decrease the area needed for the circuit, allowing even greater potential density by using a common source/drain region which can simplify fabrication.

In particular, according to the present invention, a nonvolatile memory circuit includes a substrate and spaced apart first, second and third source/drain regions in the substrate, the third source/drain region disposed between the first and second source/drain regions, the first, second and third source/drain regions having a generally elongate shape. The memory circuit also includes a first row of floating gate electrodes on the substrate, disposed between the first and third source/drain regions, a second row of floating gate electrodes on the substrate, disposed between the second and third source/drain regions, and a plurality of insulated word lines on the substrate, a respective one of the insulated word lines overlying a respective one of the first row of floating gate electrodes and a respective one of the second row of floating gate electrodes and running in a direction transverse to the first, second and third source/drain regions. The memory circuit also preferably includes a plurality of channel stop regions, a respective one of the plurality of channel stop regions being disposed between a respective pair of floating gate electrodes in a respective one of the first and second rows of floating gate electrodes.

The memory circuit also preferably includes a fourth source/drain region in the substrate, adjacent and spaced apart from the first source/drain region, a fifth source/drain region in the substrate, adjacent and spaced apart from the second source/drain region, a first insulated gate on the substrate disposed between the fourth source/drain region and the first source/drain region, and a second insulated gate on the substrate disposed between the fifth source/drain region and the second source/drain region. String select transistors are thus provided. The memory circuit may also include a sixth source/drain region in the substrate, spaced apart from the third source/drain region, and a third insulated gate on the substrate disposed between the sixth source/drain region and the third source/drain region, thus providing a ground select transistor.

The circuit also preferably includes an impurity region in the substrate, underlying the first, second and third source/drain regions, and a field oxide region on the substrate, bordering portions of the first, second and third source/drain regions. Isolation of the circuit is thereby provided.

The floating gate electrodes each preferably include an insulation layer on the substrate, a first semiconductor region on the insulation layer, and a second semiconductor region on the insulation region. Preferably, the insulation layer is silicon dioxide and the semiconductor regions polysilicon.

According to first, second and third embodiments, a sidewall insulating region adjacent sidewall portions of the first semiconductor region in each of the floating gate electrodes may be provided. In the first embodiment, the sidewall region includes an insulation layer, preferably silicon dioxide, on sidewall portions of the first semiconductor region and on adjacent portions of the substrate, a barrier layer, preferably silicon nitride, on the insulation layer, and an insulation spacer on the barrier layer. In the second embodiment, the sidewall insulating region includes an insulation layer, preferably silicon dioxide, on sidewall portions of the first semiconductor region and on adjacent portions of the substrate, and a barrier spacer, preferably silicon nitride, on the insulation layer.

The first, second and third source/drain regions may each comprise a trench in the substrate. According to a fourth embodiment, the circuit includes a borophosphosilicate glass (BPSG) region on each of the first, second and third source/drain regions, in the associated trench. In a fifth embodiment, the circuit includes an elongate conductive region on each of the first, second and third source/drain regions, in the associated trench.

According to method aspects of the invention, a nonvolatile memory circuit is formed by forming three spaced apart source/drain regions in a substrate, the three spaced apart source/drain regions including a first source/drain region, a second source/drain region, and a third source/drain region disposed between the first and second source/drain regions, each of the three source/drain regions having a generally elongate shape, forming a plurality of floating gates on the substrate, including a first row of floating gate electrodes between the first and third source/drain regions and a second row of floating gate electrodes on the substrate between the second and third source/drain regions, and a plurality of insulated word lines on the substrate, a respective one of the insulated word lines overlying a respective one of the first row of floating gate electrodes and a respective one of the second row of floating gate electrodes, transverse to the first, second and third source/drain regions.

BRIEF DESCRIPTION OF THE DRAWINGS

Some of the objects and advantages of the present invention having been stated, others will be more fully understood from the detailed description that follows and by reference to the accompanying drawings in which:

FIGS. 8A–8K, 9A–9K, 10A–10K and 11A–11K are cross-sectional views of intermediate fabrication products illustrating a first method aspect for fabricating a first embodiment of a nonvolatile memory circuit according to the present invention;

FIGS. 12A–12C and 13A–13C are cross-sectional views of intermediate fabrication products illustrating a second method aspect for fabricating second embodiment of a nonvolatile memory circuit according to the present invention;

FIGS. 19A, 19B, 20A and 20B are cross-sectional views of intermediate fabrication products illustrating a sixth method aspect for fabricating a sixth embodiment of a nonvolatile memory circuit according to the present invention.

DETAILED DESCRIPTION OF PREFERRED EMBODIMENTS

Figure 1:
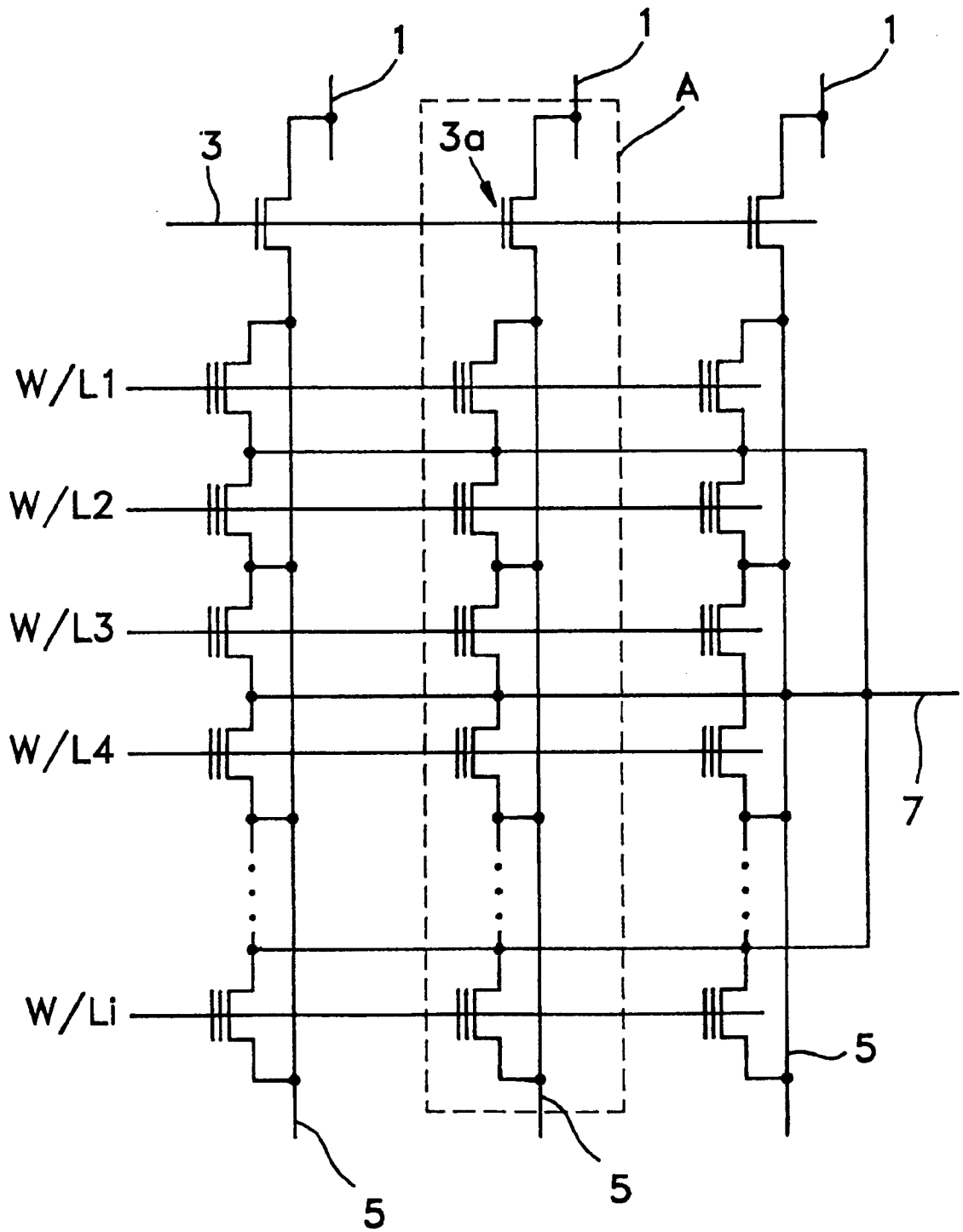
FIG. 1 is a schematic diagram of a DINOR nonvolatile memory circuit according to the prior art.
Figure 2:
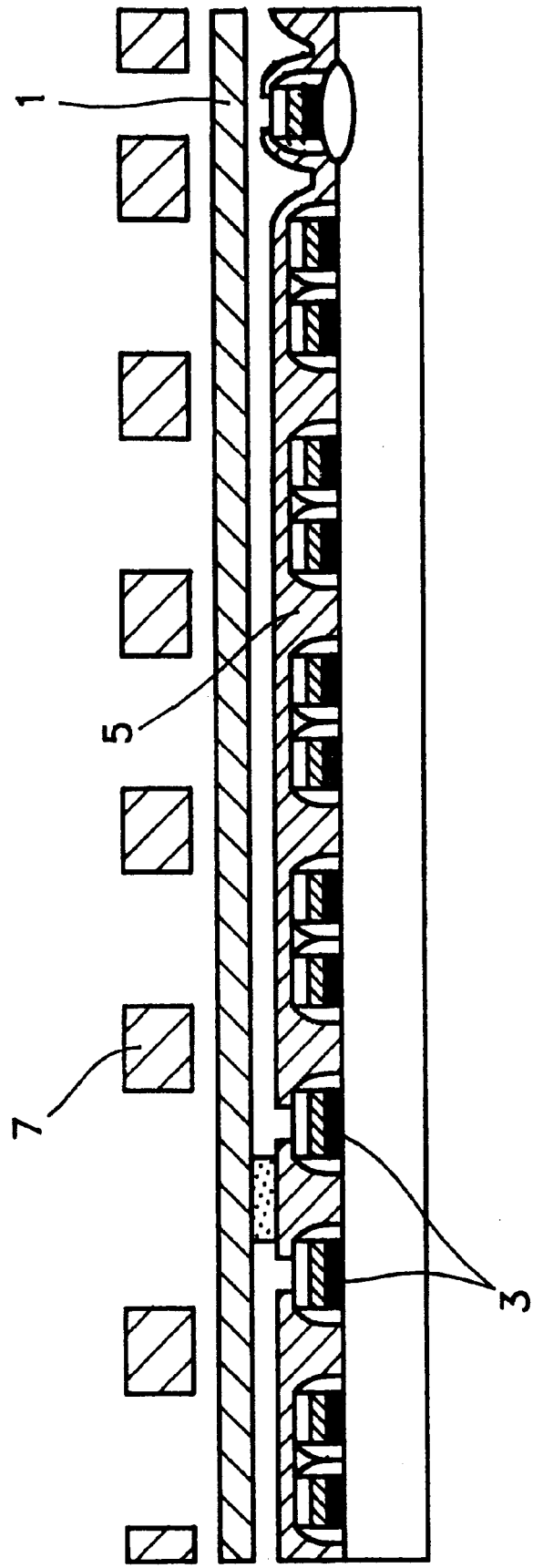
FIG. 2 is a cross-sectional view of a DINOR nonvolatile memory circuit according to the prior art.
Figure 3:
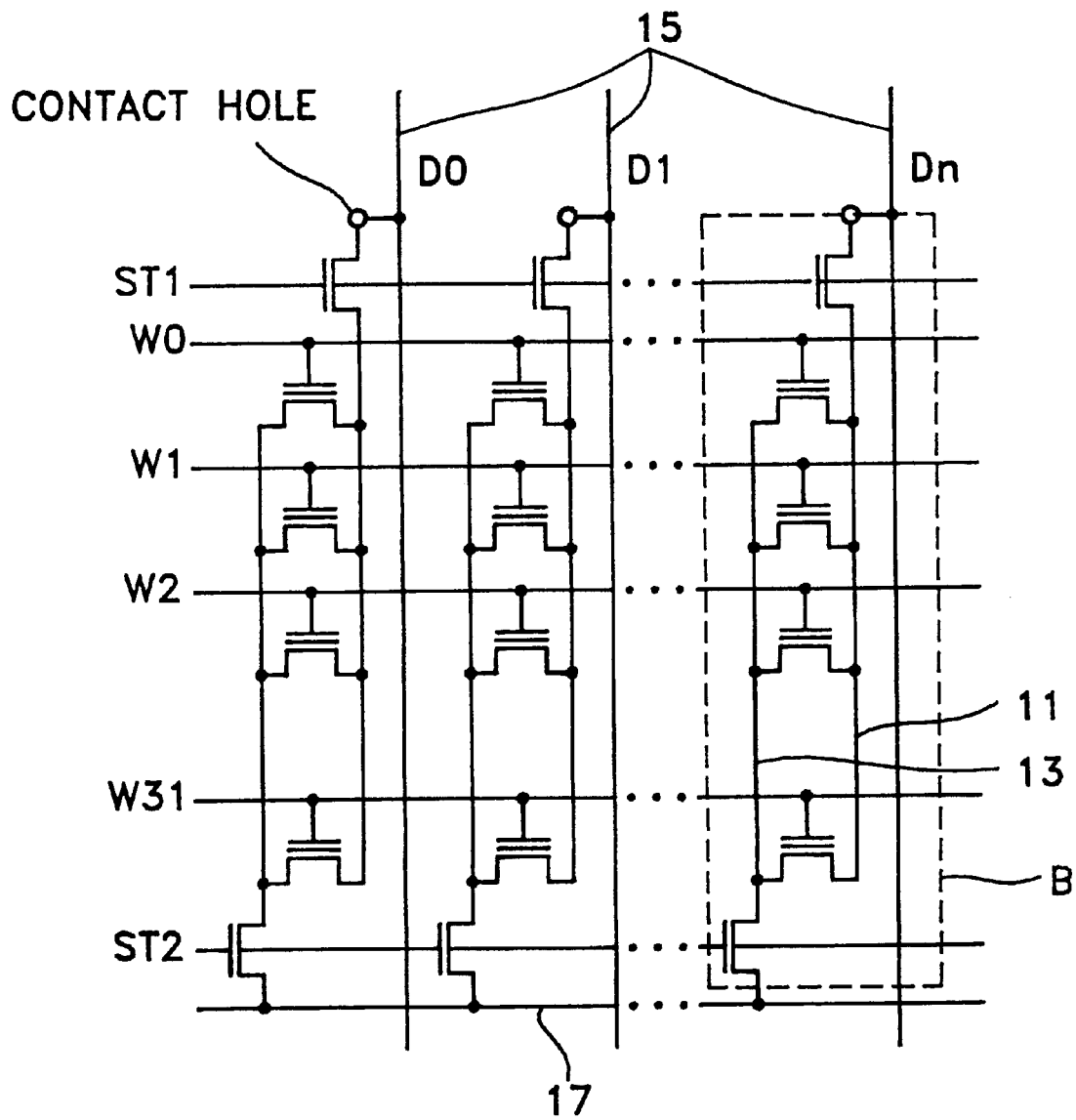
FIG. 3 is a schematic diagram of an AND nonvolatile memory cell according to the prior art.
Figure 4B:
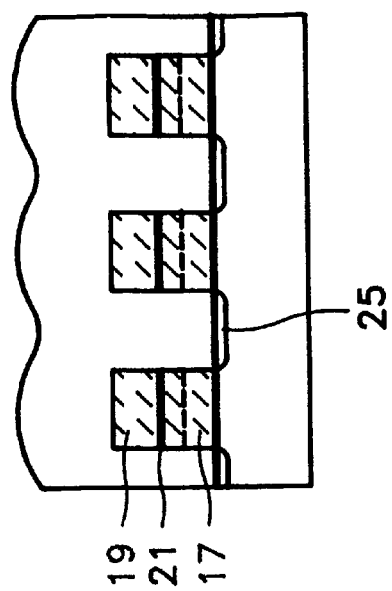
FIGS. 4A and 4B are cross-sectional views of an AND cell according to the prior art.
Figure 4A:
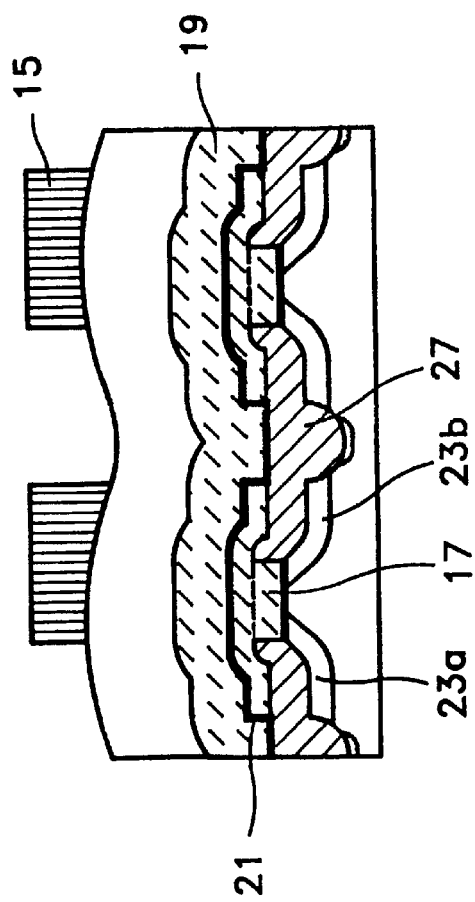

The present invention now will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity, and like numbers refer to like elements throughout. Moreover, the term "conductivity" refers to particular conductivity types such as P- or N-type. Each embodiment described and illustrated herein includes complementary embodiments.

Figure 5:
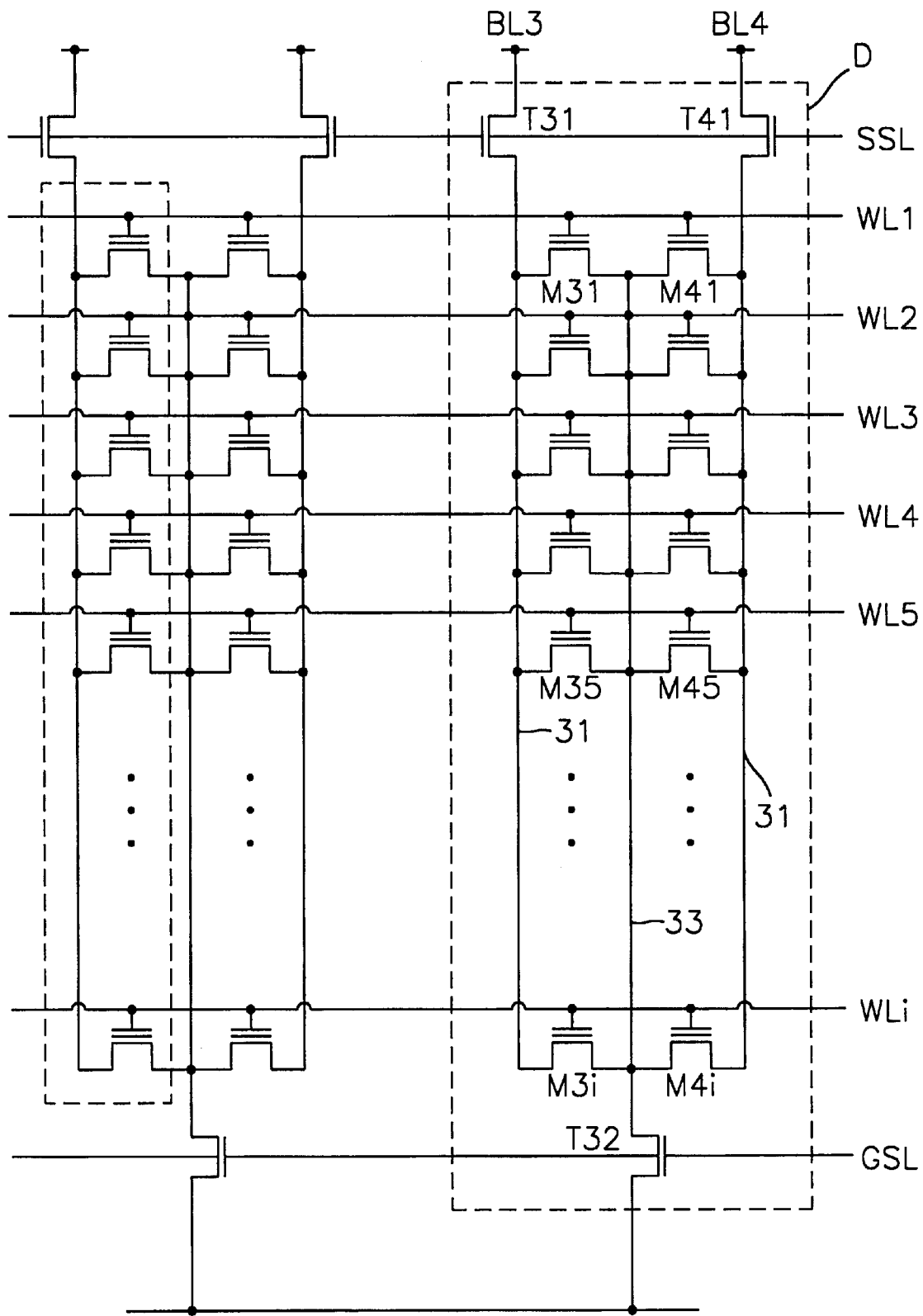
FIG. 5 is a schematic diagram of a nonvolatile memory circuit according to the present invention.

FIG. 5 is a circuit schematic illustrating a dual-string NOR (DuSNOR) memory circuit according to the present invention. The circuit D includes first and second rows of floating gate transistors M31–M3i, M41–M4i, a plurality of word lines WL1–WLi, string select transistors T31, T41 for selecting drain lines 31, and a ground select transistor T32 for selecting source line 33. A string select line SSL connects string select transistors T31, T41, and a ground select line GSL is connected to ground select transistors T32. Bit lines BL3, BL4 are connected to the drains of string select transistors T31, T41.

Figure 6:
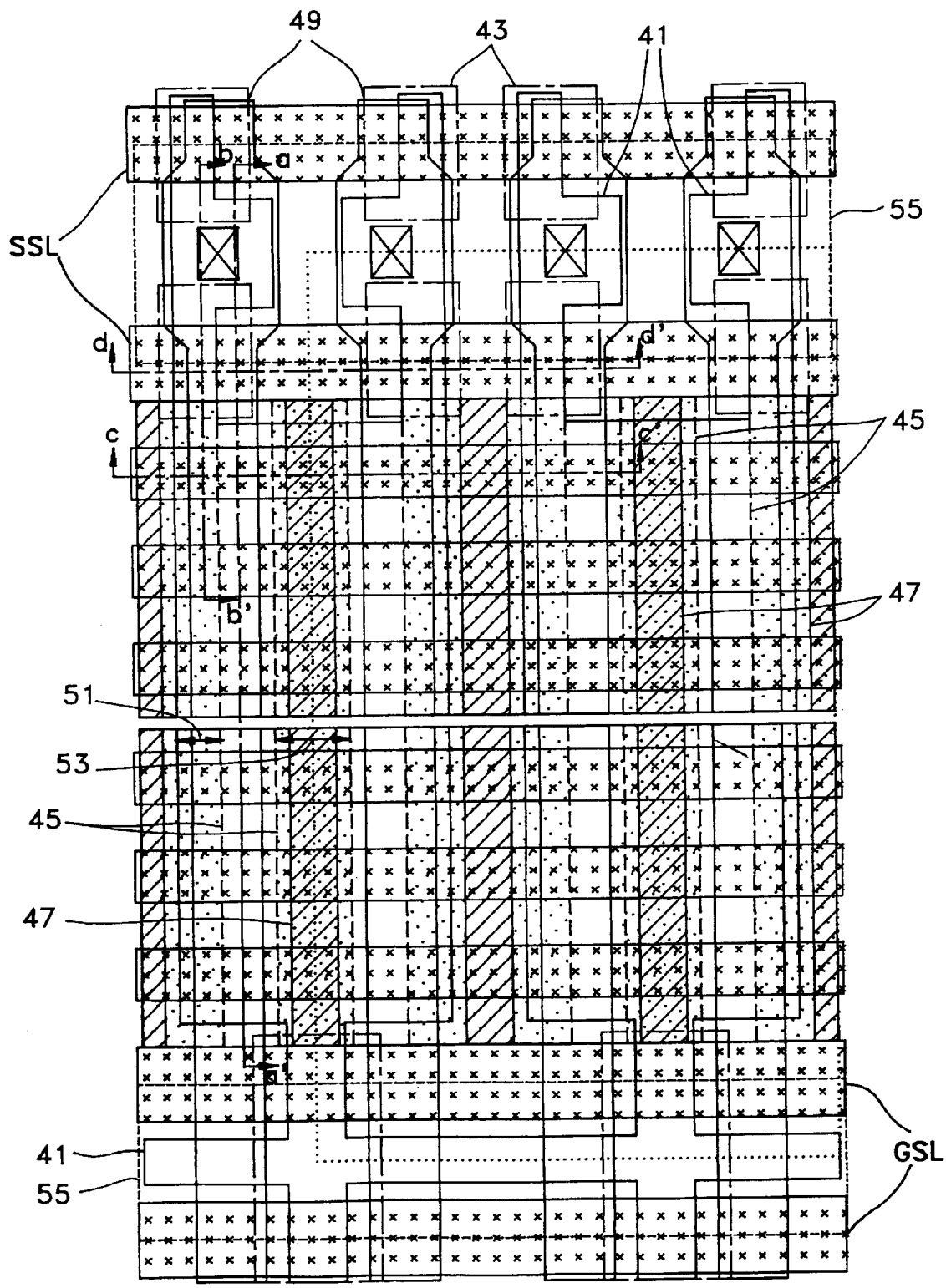
FIG. 6 is a schematic diagram illustrating a layout of a nonvolatile memory circuit according to the present invention.

FIG. 6 illustrates an exemplary layout of a DuSNOR memory circuit such as that shown in FIG. 5. The layout includes active regions 41, tunnel regions 43 and bit lines 49. First and second polysilicon layers 45, 47 form first and second semiconductor regions, respectively, of a floating gate electrode. Ion-implanted regions 55 serve as source/drain regions for string select and ground select transistors, which are controlled by string select lines SSL and ground select lines GSL, respectively. Source/drain regions for floating gate transistors are formed as junction layers 51, 53 below an insulation layer. Isolation between drain lines is provided by a field oxide layer and an underlying impurity region. To provide isolation between word lines, channel stop regions are provided by ion implantation.

Figure 7:
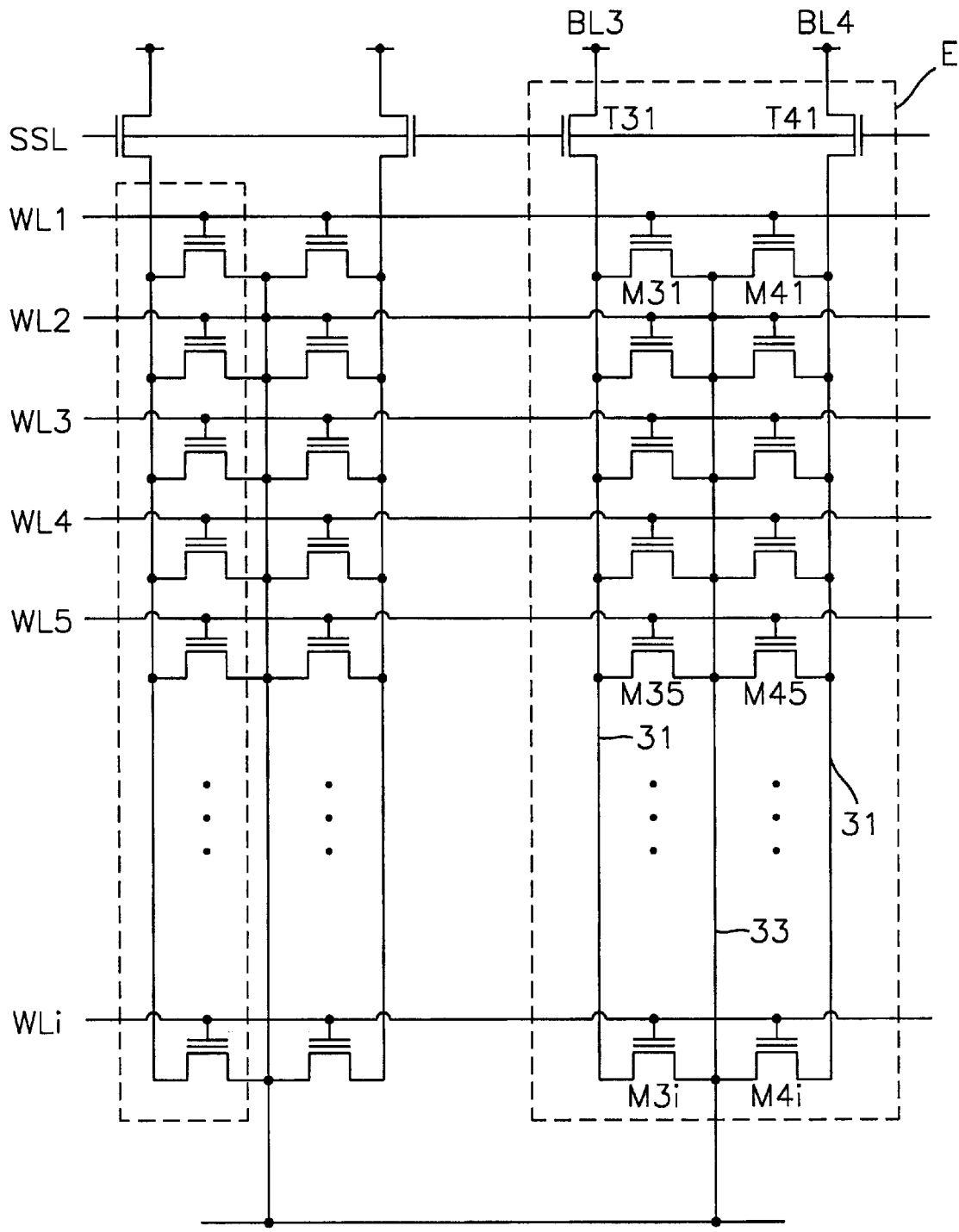
FIG. 7 is a schematic diagram of a nonvolatile memory circuit according to the present invention.
Figure 8A:
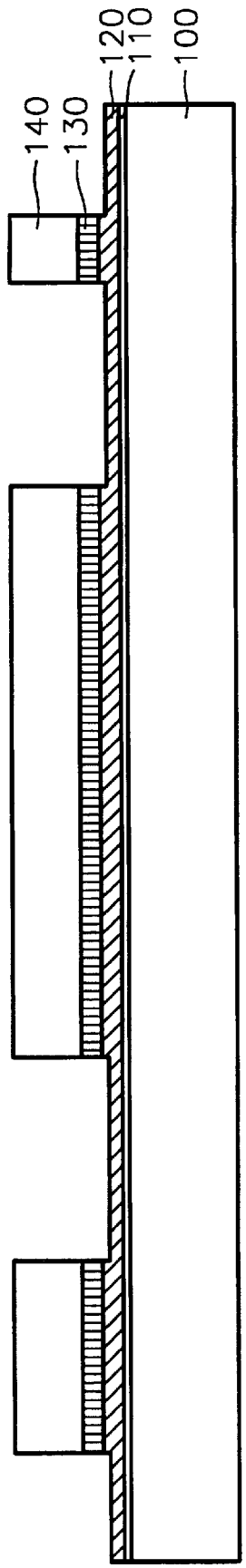
Figure 9A:
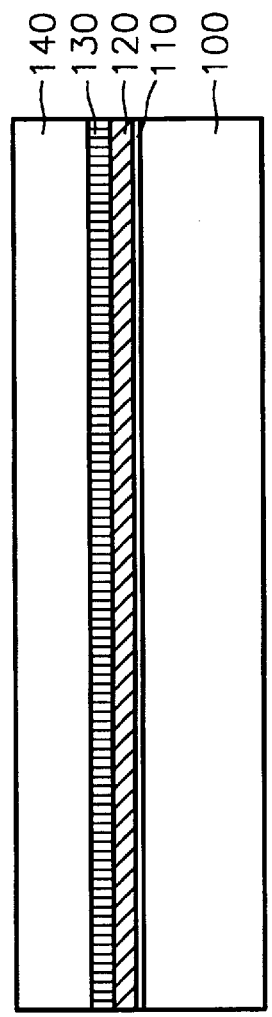
Figure 8B:
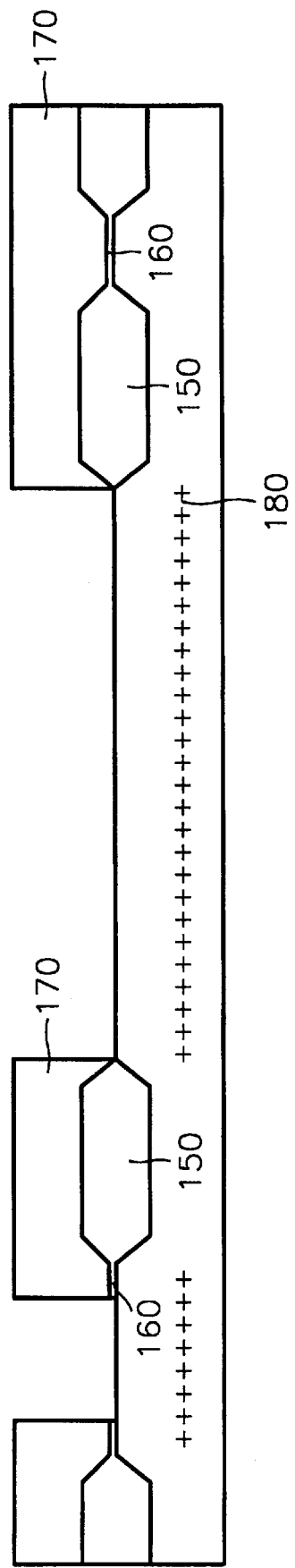
Figure 9B:
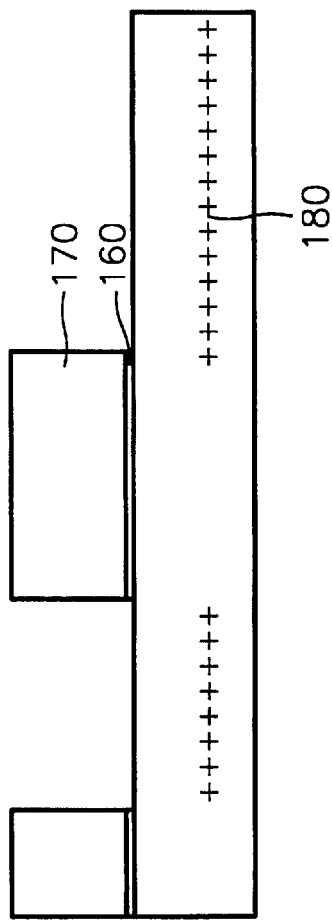
Figure 8E:
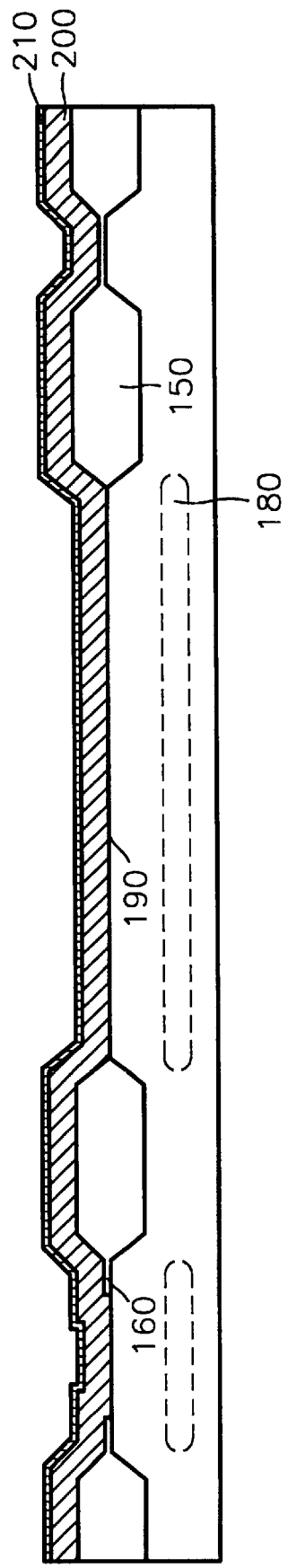
Figure 9E:
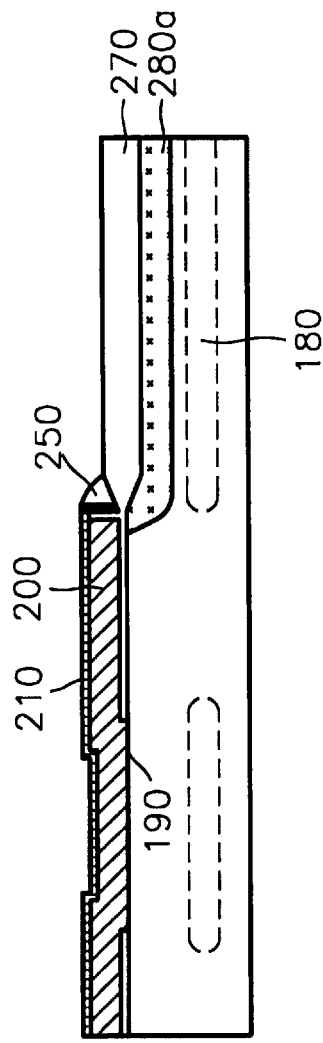
Figure 8G:
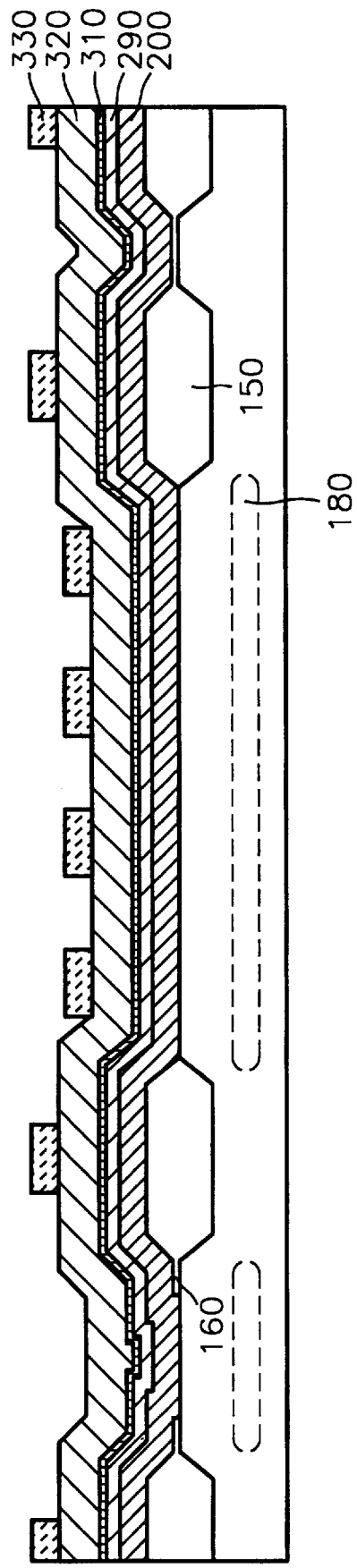
Figure 9G:
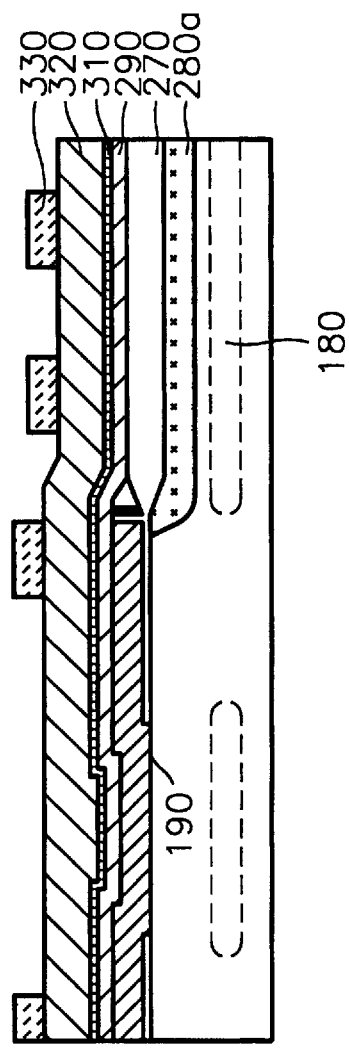
Figure 8H:
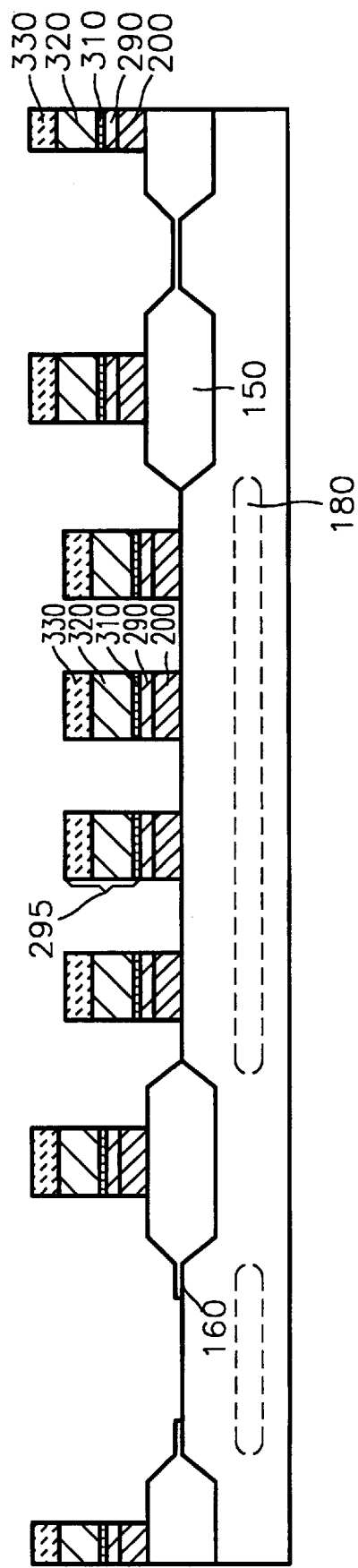
Figure 9H:
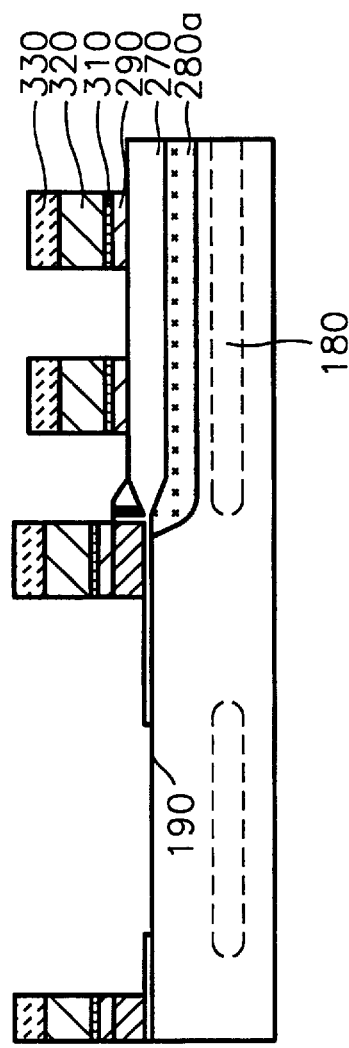
Figure 8I:
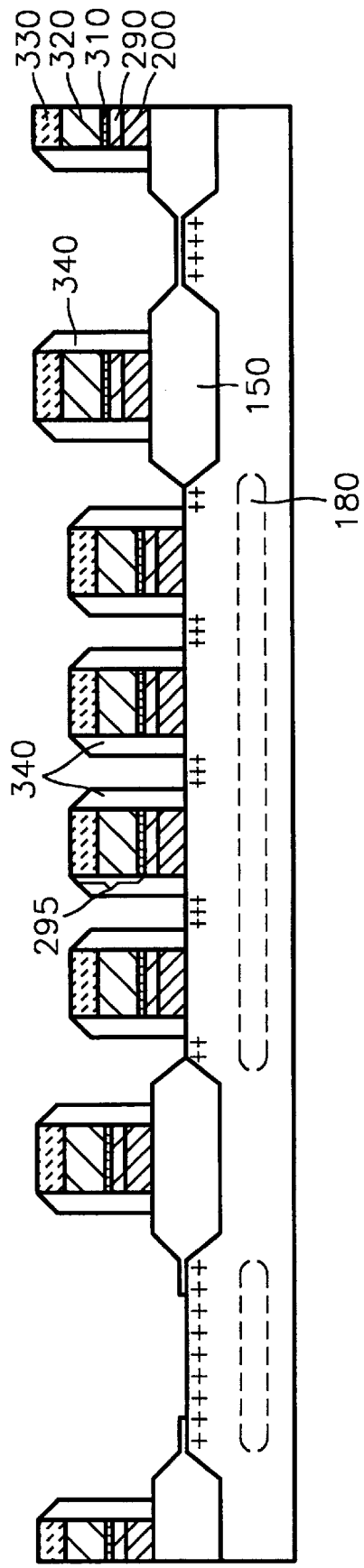
Figure 9I:
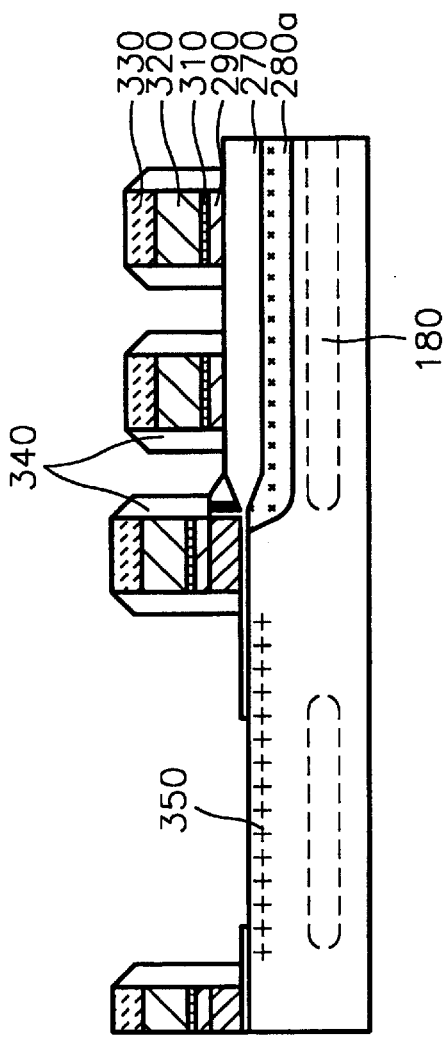
Figure 8K:
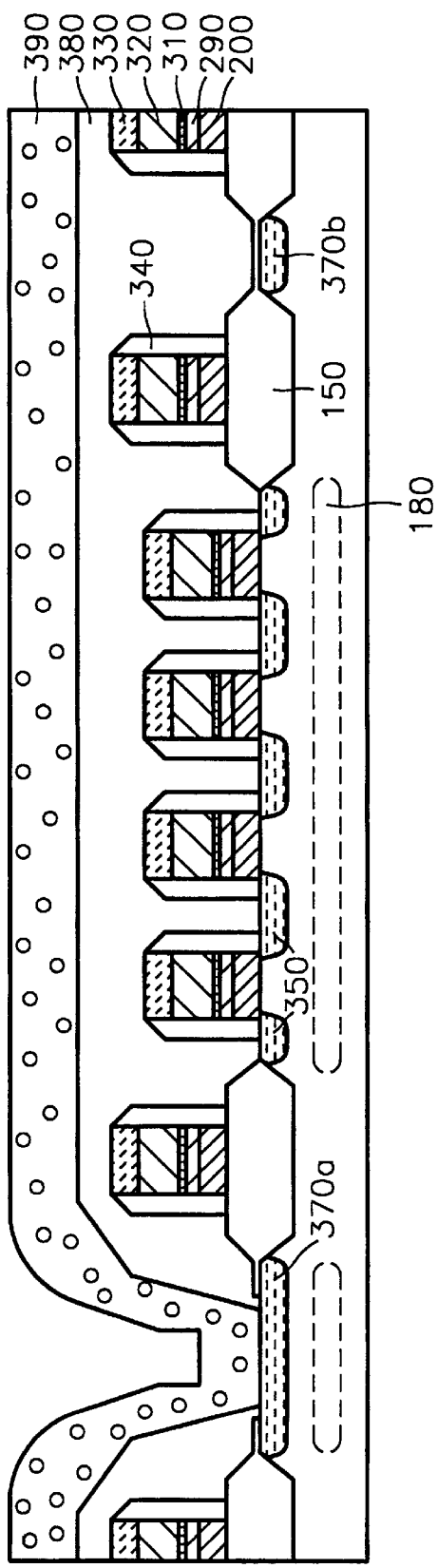
Figure 9K:
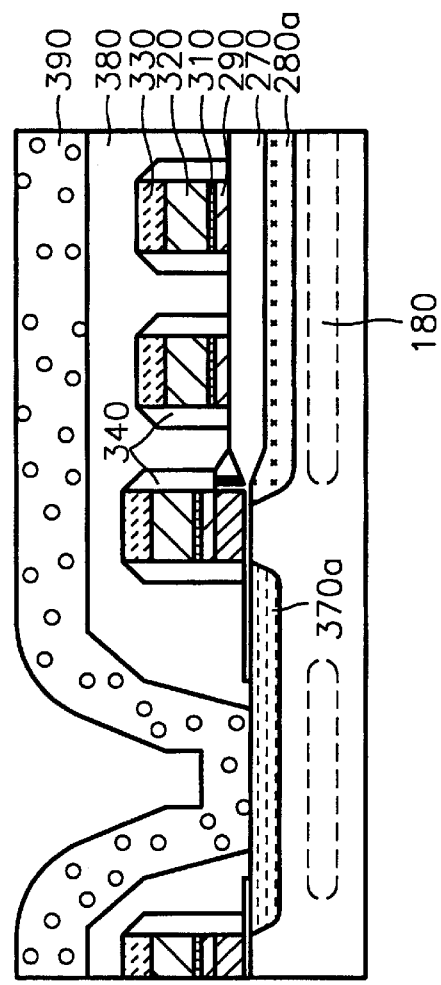
Figure 10A:
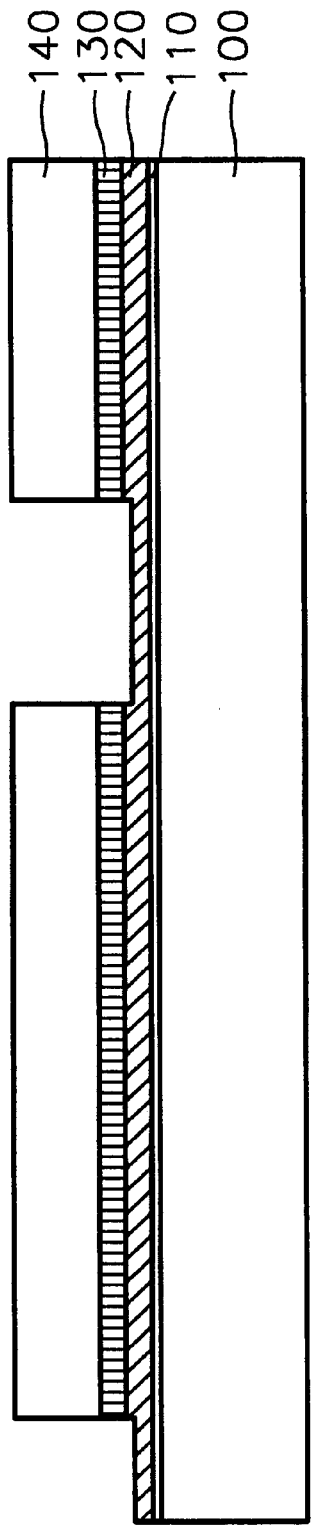
Figure 11A:
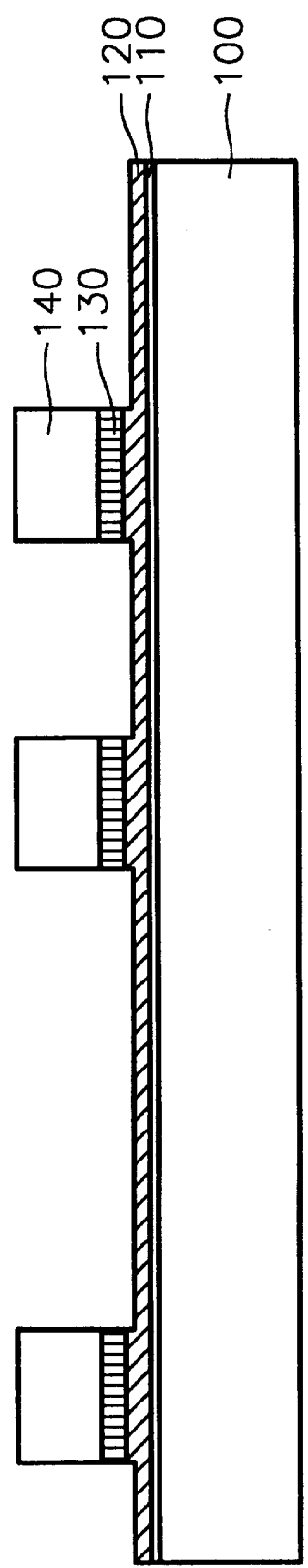
Figure 10E:
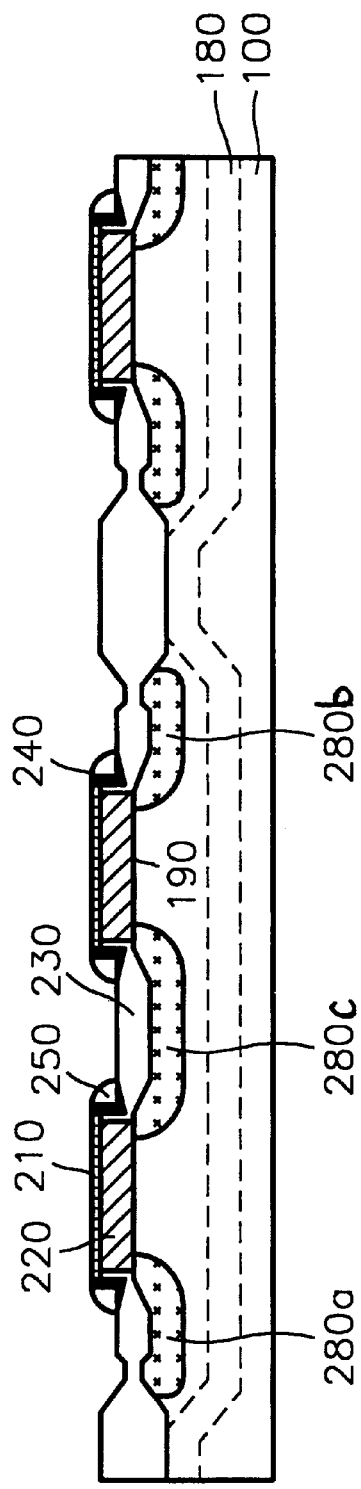
Figure 11E:
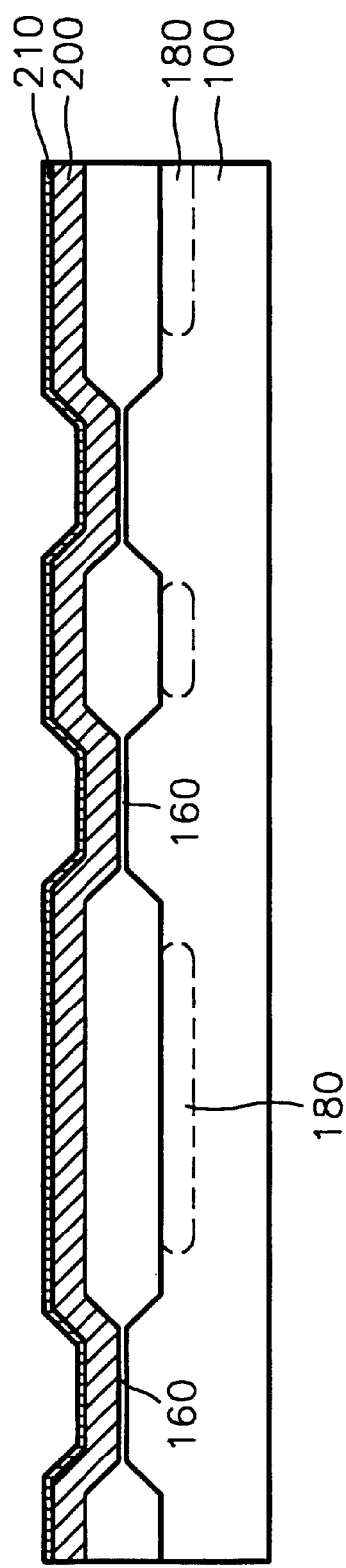
Figure 10F:
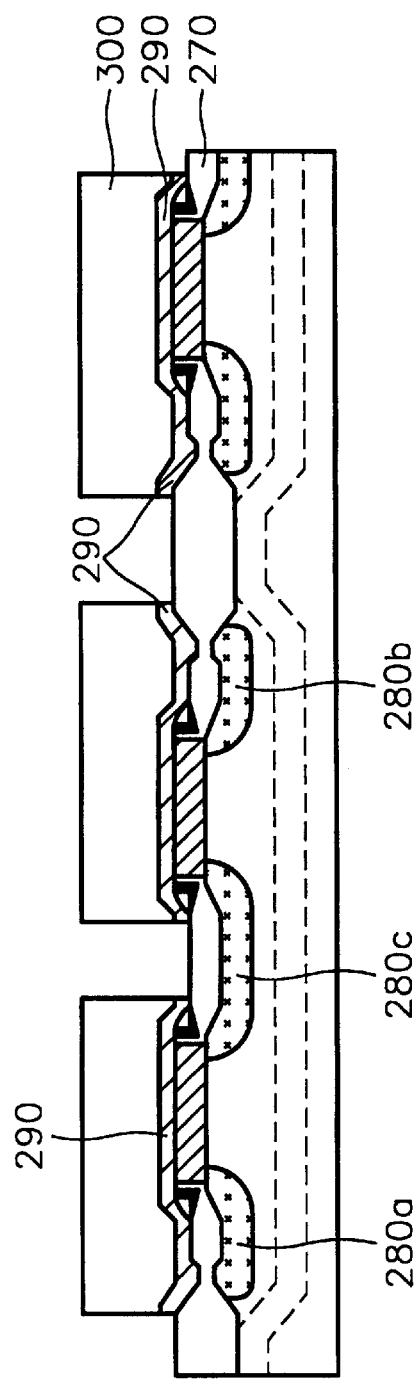
Figure 11F:
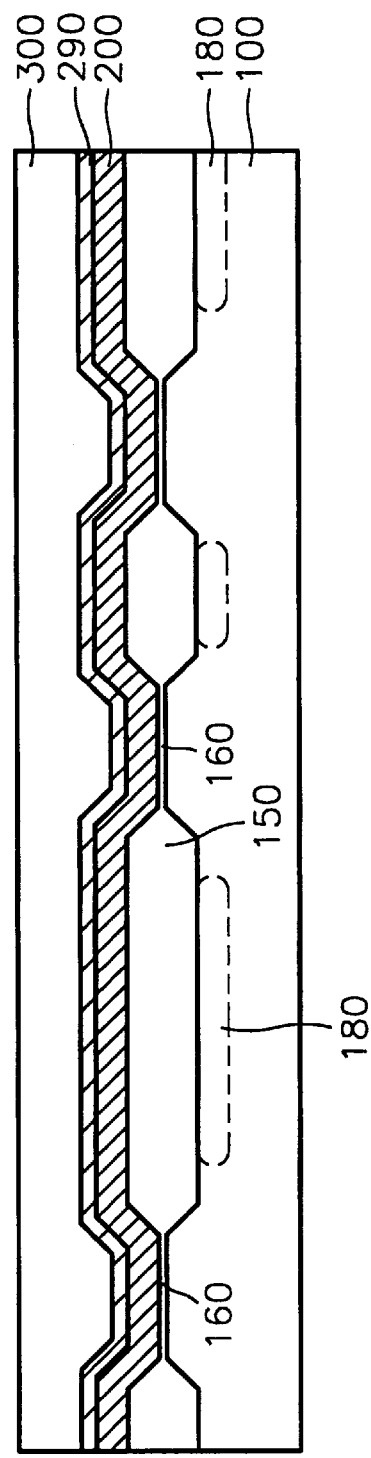
Figure 10J:
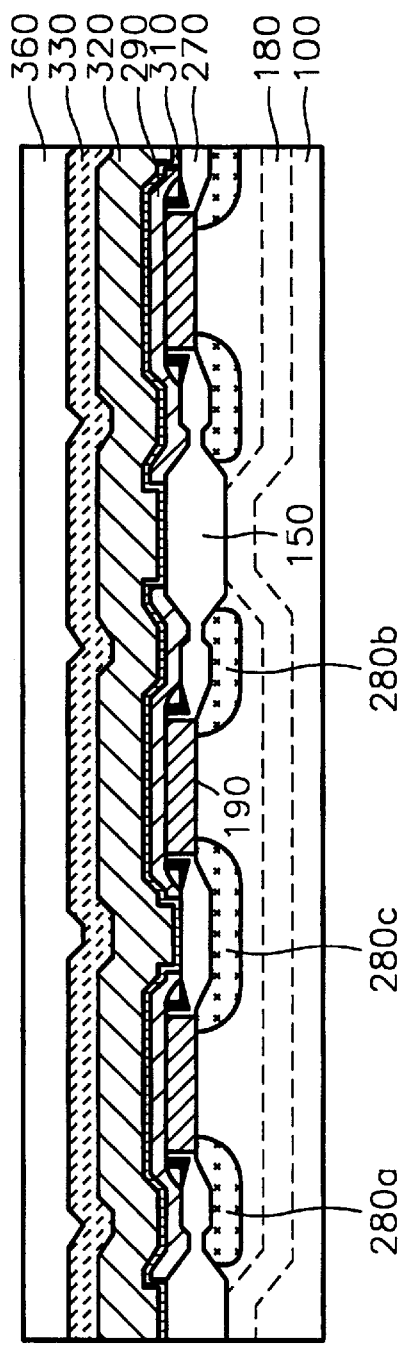
Figure 11J:
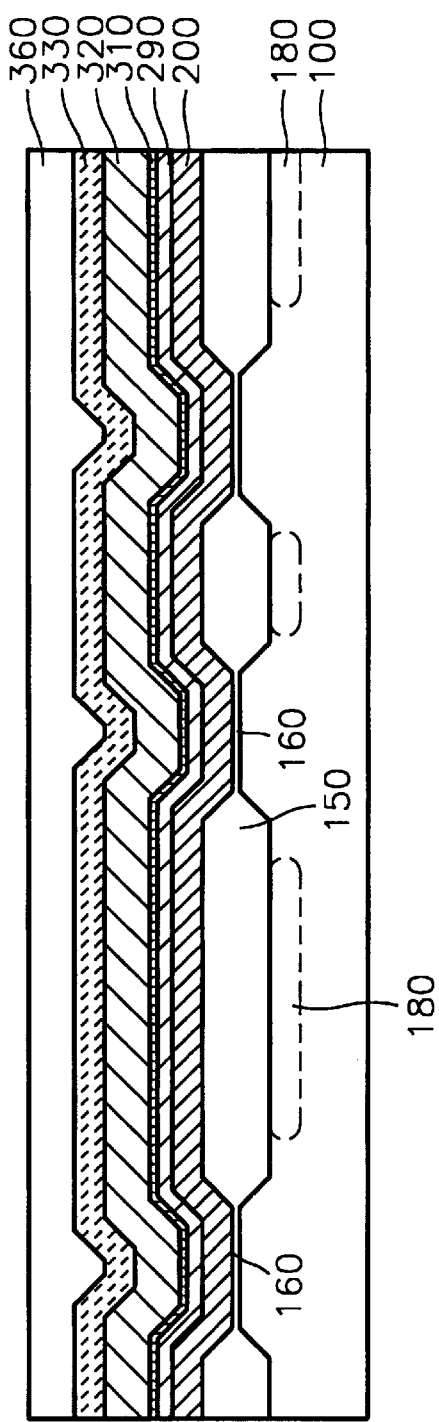
Figure 10K:
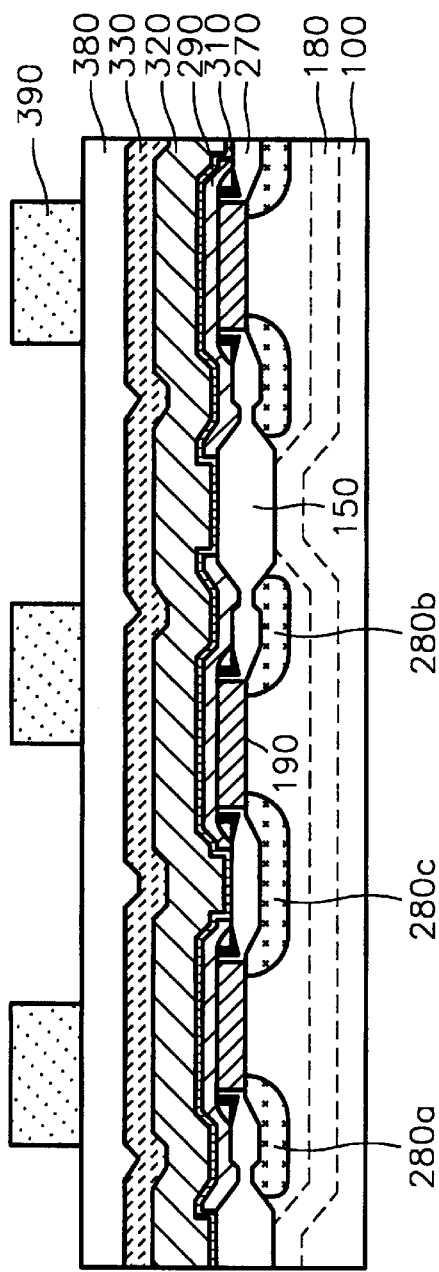
Figure 11K:
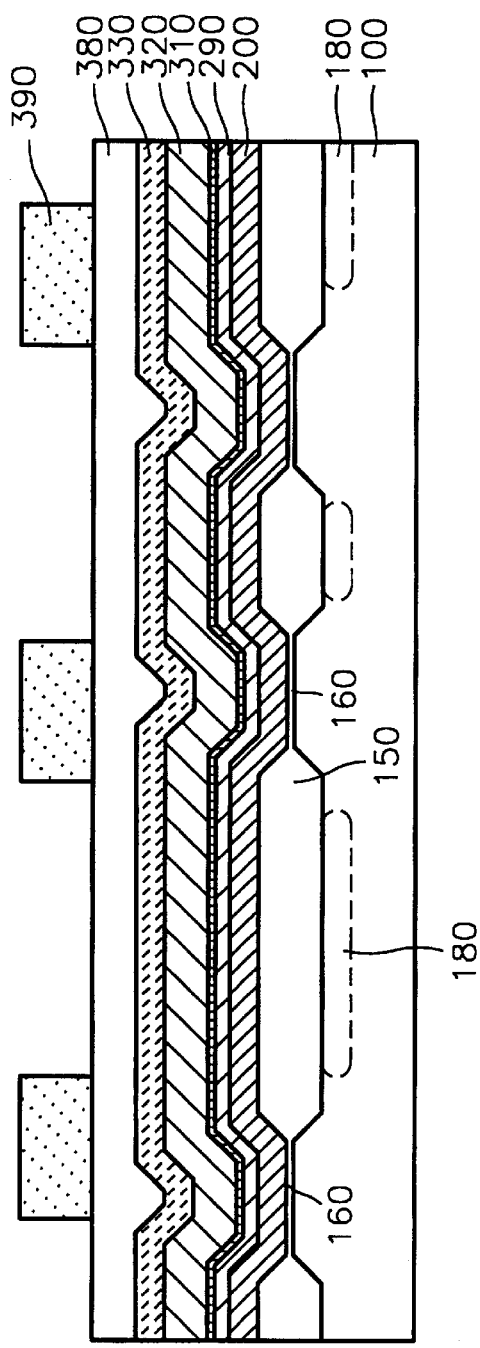

Another embodiment of a DUSNOR memory circuit according to the present invention is illustrated in FIG. 7. As is illustrated, this embodiment is similar to the embodiment of FIG. 5, except that ground select transistors are not provided. A memory circuit E includes first and second rows of floating gate transistors M31–M3i, M41–M4i, a plurality of word lines WL1–WLi, and string select transistors T31, T41 for selecting drain lines 31. A string select line SSL connects the string select transistors T31, T41, and the source electrodes of the floating gate transistors are commonly connected through source lines 33. Bit lines BL3, BL4 are connected to the drains of string select transistors T31, T41.

Methods for fabricating embodiments of the DuSNOR memory circuit of FIG. 5 will now be discussed in detail, with respect to FIGS. 8A–K, 9A–K, 10A–K, 11A–K, 12A–C, 13A–C, 14A, 15A, 16A–C, 17A–C, 18A–B, 19A–B, and 20A–B. These figures are cross-sectional views of fabrication products, and illustrate steps of methods for producing nonvolatile memory circuits according to the present invention. These figures also illustrate various preferred embodiments of nonvolatile memory circuits according to the present invention.

FIGS. 8A–8K, 9A–9K, 10A–10K and 11A–11K are cross-sectional views illustrating a first method aspect for producing an embodiment of a nonvolatile memory circuit according to the present invention. In detail, FIGS. 8A–8K are cross-sectional views taken along the line a–a' of FIG. 6, FIGS. 9A–9K are cross-sectional views taken along the line b–b' of FIG. 6, FIGS. 10A–10K are cross-sectional views taken along the line c–c' of FIG. 6, and FIGS. 11A–11K are cross-sectional views taken along the line d–d' of FIG. 6.

FIGS. 8A, 9A, 10A and 11A illustrate steps for forming an insulation layer 110, a semiconductor layer 120, and a barrier layer 130 on a substrate 100 to define an active region. As those skilled in the art will understand, the active region may be formed directly on the substrate 100 or within a well structure formed in the substrate 100, depending upon the polarity of the voltages applied during program and erase operations. Processes for forming wells are well-known, and need not be discussed in detail herein. For purposes of the following discussion, the fabrication steps described herein may be performed with or without an underlying well.

An insulation layer 110, preferably silicon dioxide having a thickness of approximately 240 Å is grown on the substrate 100. A semiconductor layer 120, preferably polysilicon having a thickness of approximately 1000 Å, is then deposited on the insulation layer 110 and a barrier layer 130, preferably silicon nitride having a thickness of approximately 1500 Å, is deposited thereon. Subsequently, a photoresist pattern 140 is formed on the barrier layer 130, and the underlying barrier layer 130 and insulation layer 110 are then dry-etched using the first photoresist pattern 140 as a mask.

FIGS. 8B, 9B, 10B and 11B illustrate steps for forming a field oxide region 150 on substrate 100 to define an active region. After removing the photoresist pattern 140, ions, preferably of the same conductivity as the substrate 100, are implanted, preferably in a dose of approximately $1.0 \times 10^{13}/\text{cm}^2$ to approximately $1.0 \times 10^{14}/\text{cm}^2$, at an energy of approximately 50 KeV. The structure is then oxidized and a field oxide layer 150 of about 6000 Å grown thereon to define an active region. Subsequently, the barrier layer 130 and the semiconductor layer 120 are removed. Thereafter, an insulation layer 160, preferably silicon dioxide of approximately 300 Å thickness, is formed on the active region, and a second photoresist pattern 170 is formed on the silicon dioxide layer 160. To improve the quality of the insulation layer 160, a sacrificial silicon dioxide of approximately 200–500 Å thickness may be grown and removed before the formation of the insulation layer 160.

In order to strengthen the isolation provided for source/drain regions formed in subsequent steps, an ion implantation of high energy preferably is performed. Preferably, the energy for the ion implantation should be high enough to penetrate through the field oxide layer 150 and into underlying portions of the substrate 100, for example, an energy of approximately 100–300 KeV for a dose of approximately $1.0 \times 10^{13} - 1.0 \times 10^{14}/\text{cm}^2$. Impurity layer 180 is thus formed at a predetermined depth. In addition to the strengthening of the isolation characteristic of bit lines and drain lines as described above, the ion implantation serves to improve bulk punchthrough characteristics of the memory cells and to adjust the initial threshold voltage of the cells. After performing the ion implantation, an ion implantation for adjusting the threshold voltage may be selectively performed. After formation of the impurity layer 180, the insulation layer 160 is selectively wet-etched using the photoresist pattern 170, and then the second photoresist pattern 170 is removed. The portion of the insulation layer 160 where string select transistors and ground select transistors are to be formed in subsequent steps is not etched.

As illustrated in FIGS. 8C, 9C, 10C and 11C, after forming an insulation layer, preferably silicon dioxide of approximately 100 Å thickness, a semiconductor layer, preferably polysilicon of approximately 1500 Å thickness, and a barrier layer, preferably silicon nitride of approximately 1000 Å thickness, are formed. A photoresist pattern 220 is formed on the barrier layer, and the barrier layer and the underlying semiconductor layer are dry-etched to form semiconductor regions 200 and barrier regions 210. At this time, it is preferable that etching profile of the semiconductor regions 200 be slightly negative, in order to help prevent the generation of stringers during subsequent self-aligned etching steps.

FIGS. 8D, 9D–9D-1, 10D–10D-1 and 11D illustrate steps for forming an insulation layer 230, a barrier layer 240 and insulation spacers 350, FIGS. 9D-1 and 10D-1 providing enlarged views of portions E and F, respectively, of FIGS. 9D and 10D. After removing the photoresist pattern 220, an insulation layer 230, preferably silicon dioxide of approximately 200–300 Å thickness, is formed on sidewall portions of the semiconductor regions 200 and on adjacent portions of the substrate 100. The insulation layer 230 provides a "bird's beak" which serves to stabilize program/erase characteristics. Subsequently, a barrier layer 240, preferably silicon nitride, is deposited on the insulation layer 230 and on sidewall portions of the barrier regions 210, preferably to a thickness of approximately 100–500 Å. Then, an insulation layer, preferably silicon dioxide covering the barrier layer 240 to a thickness of approximately 1000–2000 Å, is deposited. This insulation layer is then dry-etched to form insulation oxide spacers 250 on the barrier layer 240. Then, ions are implanted, preferably arsenic in a dose of approximately $1.0 \times 10^{15} - 6.0 \times 10^{15}/\text{cm}^2$, to form an impurity layer 260.

FIGS. 8E, 9E, 10E and 11E illustrate steps for forming first, second and third source/drain regions 280a–c, underlying insulation layer 270. The ion-implanted substrate is oxidized to form the insulation layer 270, preferably to a thickness of approximately 2000 Å in the ion-implanted region. During oxidation, the first, second and third source drain regions 280a–c are formed under the insulation layer 270. The barrier regions 210 and the barrier layer 240 serve to prevent oxidation of the semiconductor regions 200 during the oxidation. In addition, the insulation spacers 250 control the length of the channels between the diffused source/drain regions 280a–c.

Referring to FIGS. 8F, 9F, 10F and 11F, the barrier regions 210 are removed by dry-etching or wet-etching to expose the surface of the semiconductor regions 200. Subsequently, a semiconductor layer is deposited, preferably polysilicon of a thickness of approximately 1000 Å. A photoresist pattern 300 is formed on the semiconductor layer, and the underlying semiconductor layer is dry-etched using the photoresist pattern 300 as a mask, to form semiconductor regions 290.

As illustrated in FIGS. 8G, 9G, 10G and 11G, the photoresist pattern 300 is removed, and an insulation layer, preferably an oxide-nitride-oxide (ONO) layer including a silicon dioxide layer of approximately 100 Å thickness, a silicon nitride layer of approximately 100–200 Å thickness, and another silicon dioxide layer of approximately 30–60 Å thickness, is then formed on the semiconductor regions 290. A semiconductor layer, preferably polysilicon of approximately 3000 Å thickness, and an insulation layer, preferably silicon dioxide of approximately 3000 Å thickness, is formed thereon. The insulation layer is then is then patterned to form insulation regions 330.

As illustrated in FIGS. 8H, 9H, 10H and 11H, the semiconductor layer, the insulation layer, and the semiconductor regions 290, 200 underlying the insulation regions 330 are then etched using the insulation regions 330 as an etching mask, thereby forming first and second rows of floating gate electrodes 285 and a plurality of insulated word lines 295 which run transverse to the first, second and third source/drain regions 280a–c. Each floating gate electrode 285 includes an insulation region 190 and stacked semiconductor regions 200, 290. Each insulated word line 295 includes an insulation region 310, a semiconductor region 320, and an overlying insulation region 330, and overlies a respective one of the floating gate electrodes from the first row and a respective one of the floating gate electrodes from the second row.

FIGS. 8I, 9I, 10I and 11I illustrate steps for forming a plurality of channel stop regions for isolating adjacent cells. An insulation layer, preferably silicon dioxide of approximately 1000–1500 Å thickness, is deposited and dry-etched to form insulations spacers 340 on sidewall portions of the insulated word lines 295 and the floating gate electrodes 285. Ions, preferably of the same conductivity as the substrate 100, are then implanted, preferably in a dose of approximately $1.0 \times 10^{12} - 1.0 \times 10^{14}/cm^2$. Preferably, a photoresist pattern is formed overlying the common third source/drain region 280c and at locations where bit line contacts are to be formed in subsequent steps, before the ion implantation, in order to prevent lowering of the junction break-down voltage of the common third source/drain region 280c and the subsequently-formed bit line contact. Also, a $p^-/p^+$-DDD cell channel stop junction may be implemented by implanting $p^-$ ions before forming the second insulation spacers 340, and then implanting $p^+$ ions. Thus, the width of the memory cell may be preserved and isolation enhanced.

FIGS. 8J, 9J, 10J and 11J illustrate steps for forming an ion implantation for source/drain regions for string select and ground select transistors. A photoresist pattern 360 is formed and ions are implanted, preferably arsenic in a dose of approximately $1.0 \times 10^{15} - 6.0 \times 10^{15}/cm^2$. Diffusion forms source/drain regions 370a-b for string select and ground select transistors.

FIGS. 8K, 9K, 10K and 11K illustrate steps for forming a bit line 390. The photoresist pattern 360 is removed, and insulation and borophosphosilicate glass (BPSG) layers are deposited to form an intermediate insulation layer 380. The intermediate insulation layer 380 is then etched to form a contact hole. A bit line 390 is then formed on the substrate, contacting the string select transistor source/drain region 370a.

Figure 12A:
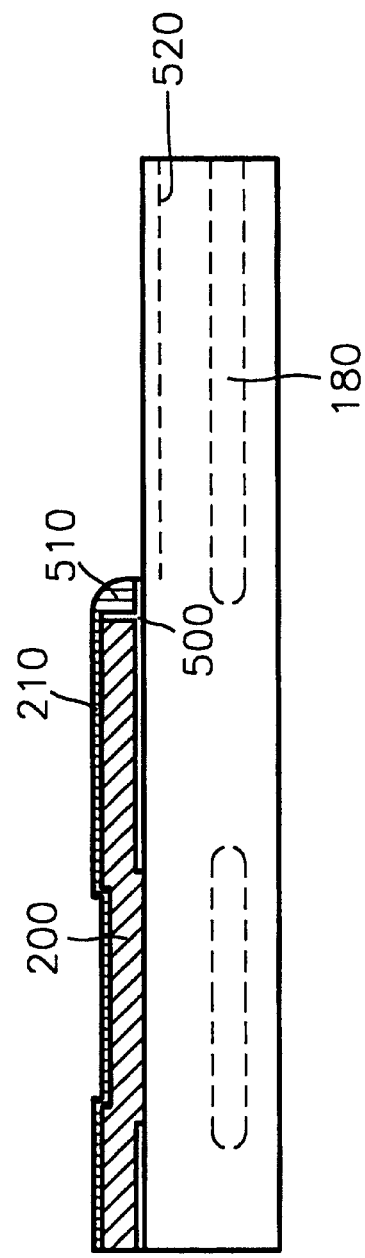
Figure 12C:
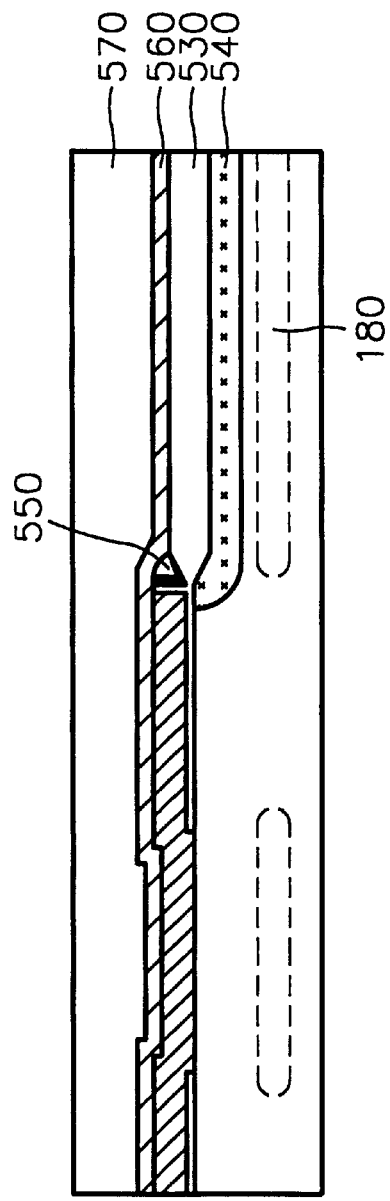

FIGS. 12A through 12C and 13A through 13C are cross-sectional views illustrating a second method aspect for forming a second embodiment of a nonvolatile memory circuit according to the present invention. In particular, FIGS. 12A–12C are cross-sectional views taken along the line b–b' of FIG. 6, and FIGS. 13A–13C are cross-sectional views taken along the line c–c' of FIG. 6.

Figure 13A:
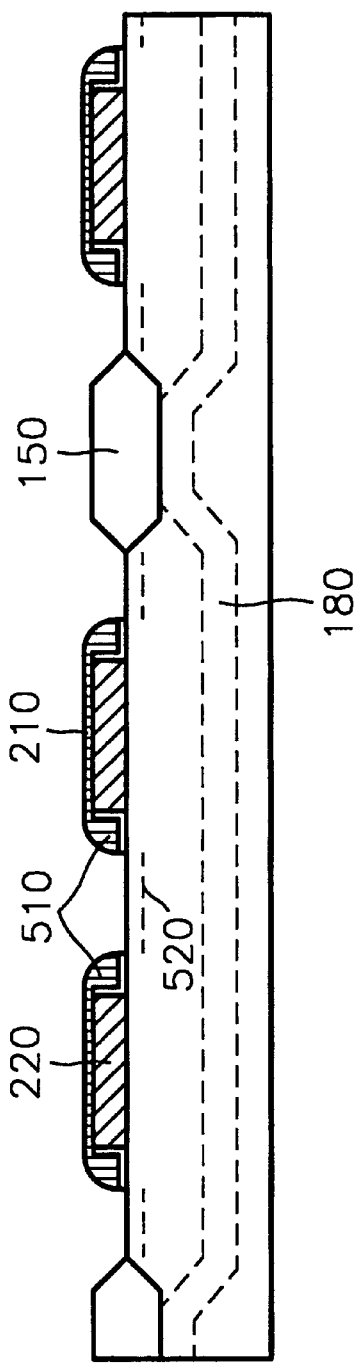

According to the second method aspect, to form the second embodiment of a nonvolatile memory circuit according to the present invention, the steps of the previously described first method aspect through the steps described in relation to FIGS. 8C, 9C, 10, and 11C, are first performed. As illustrated in FIGS. 12A and 13A, instead of forming the structures on sidewall portions of the semiconductor regions 200 as described for the first aspect, an insulation layer 500, preferably silicon dioxide of approximately 200–300 Å thickness, is formed on sidewall portions of the semiconductor regions 200 and on adjacent portions of the substrate 100, forming a gate bird's beak for stabilizing program/erase operation characteristics. A silicon nitride layer is then formed on to a thickness of approximately 1000–2000 Å, and dry-etched to form silicon nitride spacers 510 on the insulation layer 500, while leaving the barrier regions 210 on the top portions of the semiconductor regions 200. Next, ions are implanted, preferably arsenic in a dose of approximately $1.0 \times 10^{15} - 6.0 \times 10^{15}/cm^2$, forming an impurity layer 520. As illustrated in FIGS. 12B and 13B, first, second, and third source/drain regions 540a–c are formed underlying an insulation layer 530, preferably silicon dioxide, by thermal oxidation. Preferably, the insulation layer 530 has a thickness of approximately 2000 Å over the source/drain regions.

Figure 13C:
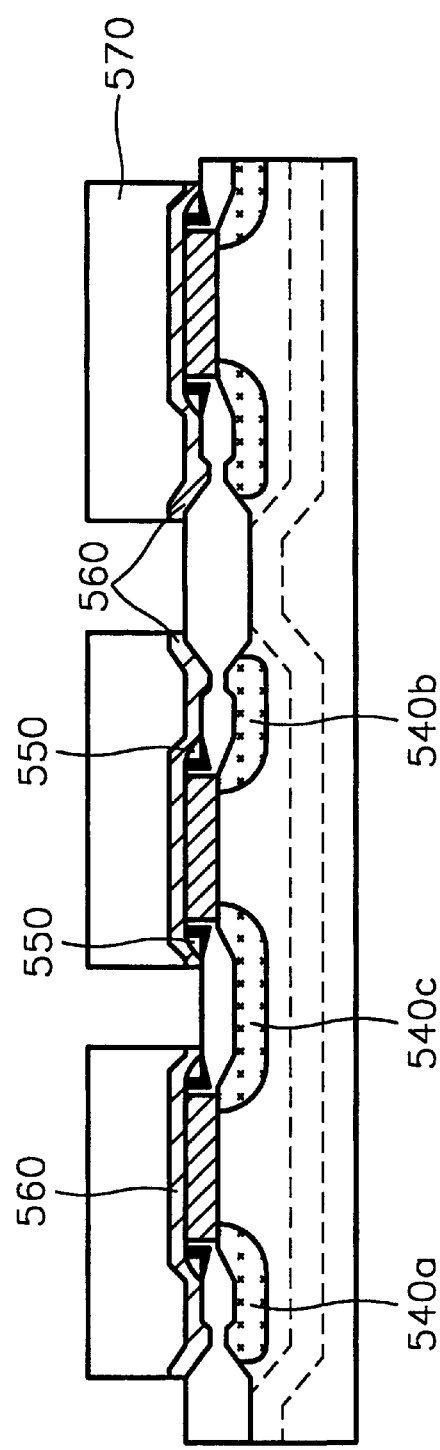

Referring to FIGS. 12C and 13C, the barrier regions 210 and silicon nitride spacers 510 are removed. An insulation layer, preferably silicon dioxide of a thickness of approximately 1000–1500 Å, is formed and then dry-etched to form insulation spacers 550 on sidewall portions of the semiconductor regions 200. A semiconductor layer, preferably polysilicon of a thickness of approximately 1000 Å, is deposited and then patterned using a photoresist pattern 570 to form additional semiconductor regions 560 in contact with the semiconductor regions 200. To complete the fabrication, the steps described in relation to FIGS. 8G–K, 9G–K, 10G–K and 11G–11K for the first method aspect may be performed.

Figure 14A:
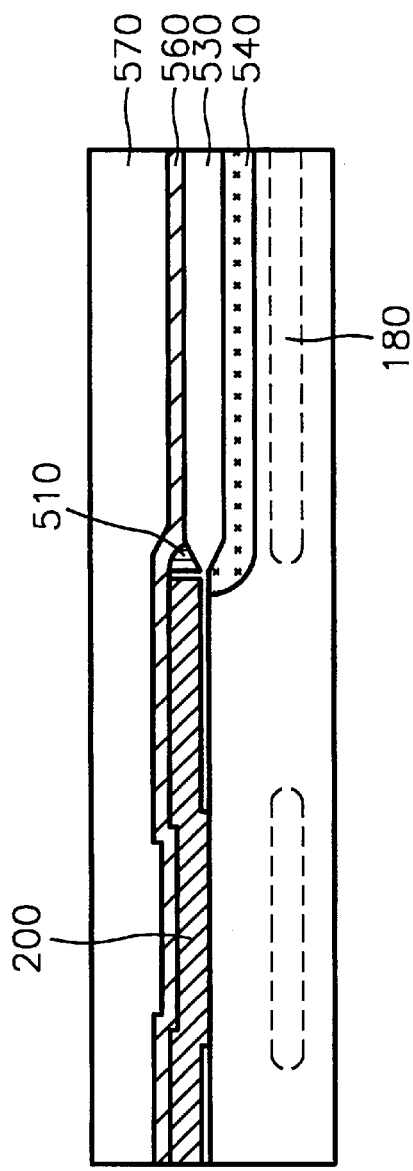
FIGS. 14A and 15A are cross-sectional views of intermediate fabrication products illustrating a third method aspect for fabricating a third embodiment of a nonvolatile memory circuit according to the present invention.
Figure 15A:
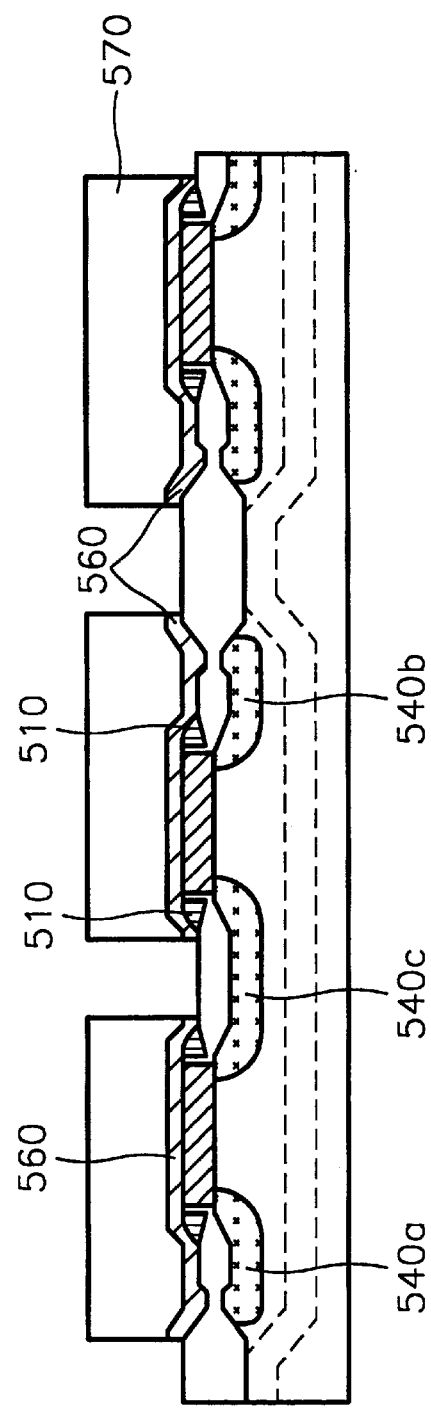

FIGS. 14A and 15A are cross-sectional views illustrating a third method aspect for forming a third embodiment of a nonvolatile memory circuit according to the present invention. In particular, FIG. 14A is a cross-sectional view taken along the line b–b' of FIG. 6, and FIG. 15A is a cross-sectional view taken along the line c–c' of FIG. 6.

According to the third method aspect, to form a third embodiment of a nonvolatile memory circuit according to the present invention, the steps described in relation to the second method aspect up to the steps described in relation to FIGS. 12B and 13B are performed. As illustrated in FIGS. 14A and 15A, the barrier regions 210 are removed, but the silicon nitride spacers 510 are not removed. A semiconductor layer, preferably polysilicon of a thickness of approximately 1000 Å, is deposited and patterned using a photoresist pattern 570 to form semiconductor regions 560. To complete fabrication, the steps described in relation to FIGS. 8G–K, 9G–K, 10G–K and 11G–11K for the first and second method aspects may then be performed.

Figure 16A:
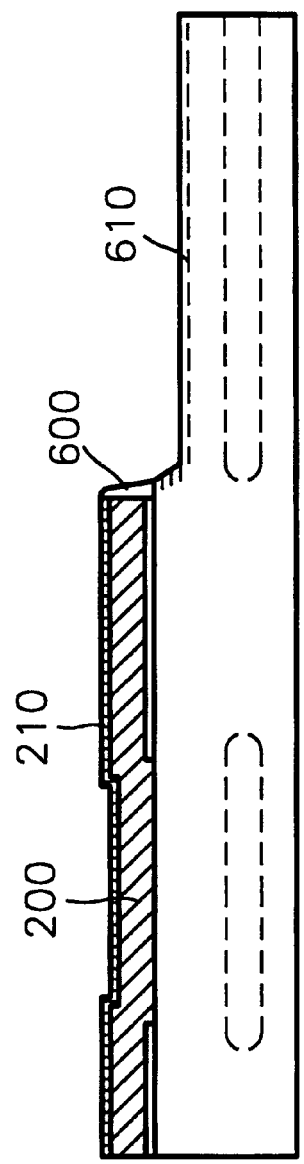
FIGS. 16A–16C and 17A–17C are cross-sectional views of intermediate fabrication products illustrating a fourth method aspect for fabricating a fourth embodiment of a nonvolatile memory circuit according to the present invention.
Figure 16B:
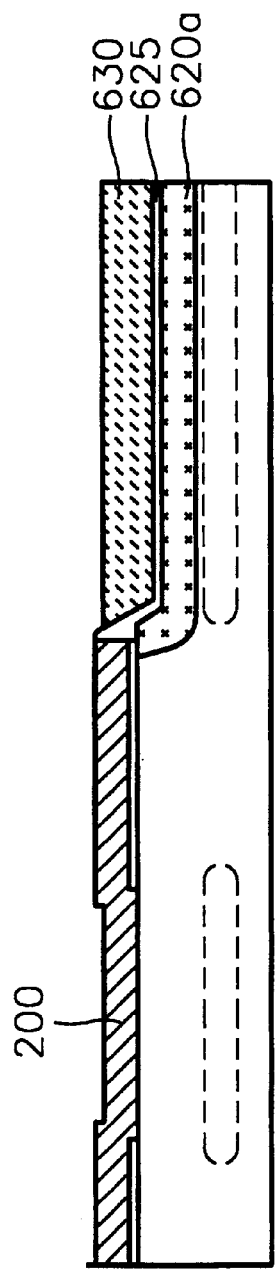
Figure 16C:
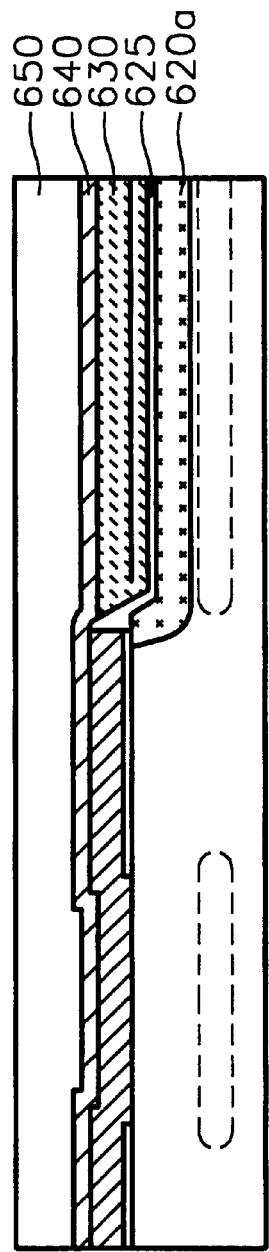

FIGS. 16A through 16C and FIGS. 17A through 17C are cross-sectional views illustrating a fourth method aspect for forming a fourth embodiment of a nonvolatile memory circuit according to the present invention. In particular, FIGS. 16A–16C are crosssectional views taken along the line b–b' of FIG. 6, and FIGS. 17A–17C are cross-sectional views taken along the line c–c' of FIG. 6.

Figure 17A:
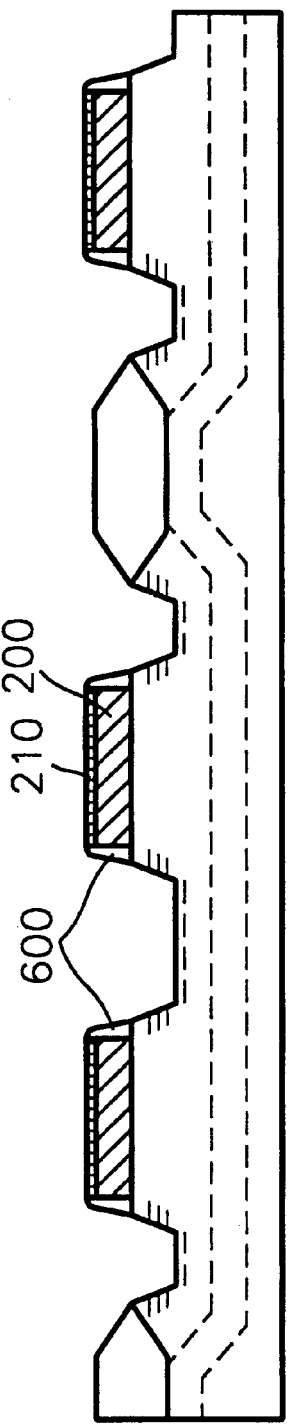

According to the fourth method aspect, to fabricate a fourth embodiment of a nonvolatile memory circuit according to the present invention, the steps described in relation to the first method aspect up to the steps described in relation to FIGS. 8C, 9C, 10C, and 11C, are first performed. As illustrated in FIGS. 16A and 17A, an insulation layer, preferably silicon dioxide of approximately 1000~1500 Å thickness, is formed and then dry-etched in order to form insulation spacers 600 on sidewall portions of the semiconductor regions 200. Adjacent portions of the substrate are then etched using the insulation spacers 600 and the barrier regions 210 as an etching mask. The more deeply the substrate is etched, the longer the trench sidewalls 605 become, allowing the resistance of the source/drain regions subsequently formed therein to be reduced, and facilitating formation of an insulation layer on the source/drain regions. Subsequently, ions are implanted, preferably arsenic in a dose of approximately $1.0 \times 10^{15} - 6.0 \times 10^{15}/cm^2$, forming impurity regions 610.

Figure 17B:
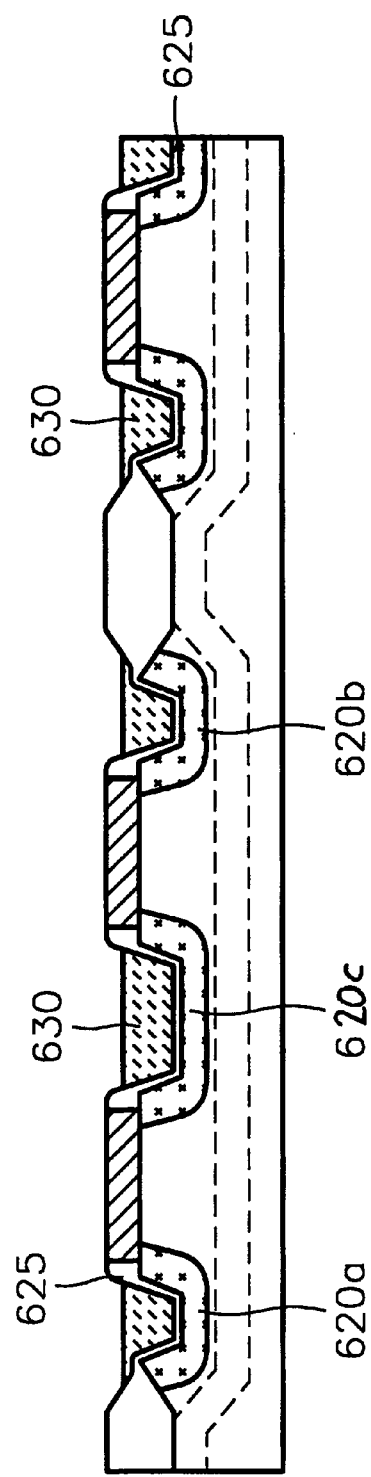

As illustrated in FIGS. 16B and 17B, first, second and third source/drain regions 620a–c and overlying insulation layer 625 are then formed in the trenches by thermal treatment. Preferably, the insulation layer 625 has a thickness of approximately 500–1000 Å. A borophosphosilicate glass (BPSG) layer of approximately 3000–6000 Å thickness is then deposited and thermally treated, preferably at a high temperature of approximately 900–950° C., to planarize the BPSG layer. The BPSG layer is then etched down to expose the semiconductor regions 200 and form BPSG regions 630 overlying the first, second and third source/drain regions 620a–c. Instead of silicon nitride, the barrier regions 210 may be silicon dioxide, as they serve as etching stoppers instead of oxidation barriers.

Figure 17C:
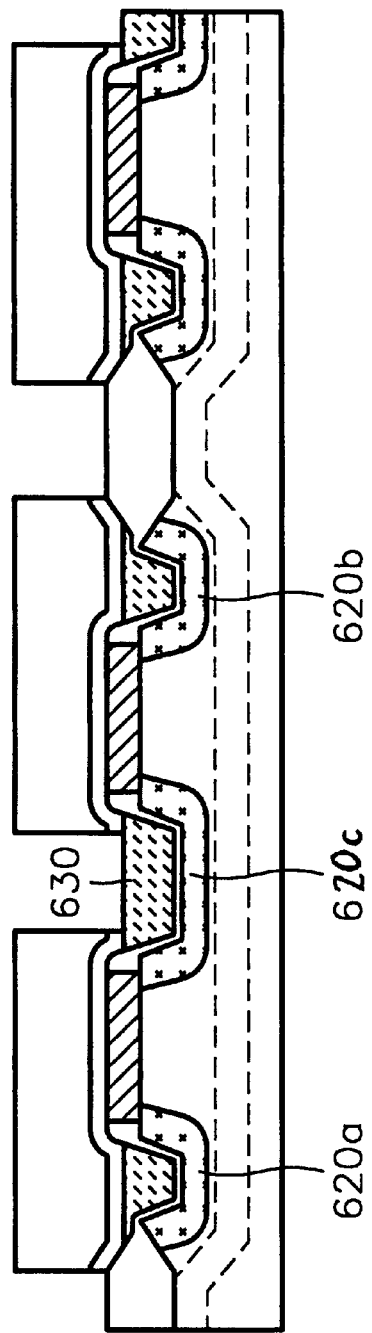

As illustrated in FIGS. 16C and 17C, after depositing a third semiconductor layer 640, preferably polysilicon of a thickness of approximately 1000 Å, the third semiconductor layer 640 is dry-etched using a photoresist pattern 650 as an etching mask. To complete fabrication, the steps described in relation to FIGS. 8G–K, 9G–K, 10G–K and 11G–11K for the first, second and third method aspects may then be performed.

Figure 18A:
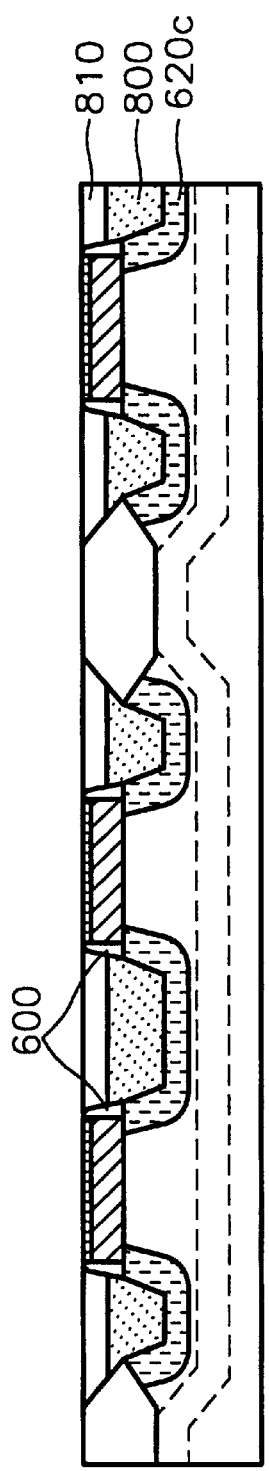
FIGS. 18A and 18B are cross-sectional views of intermediate fabrication products illustrating a fifth method aspect for fabricating a fifth embodiment of a nonvolatile memory circuit according to the present invention.
Figure 18B:
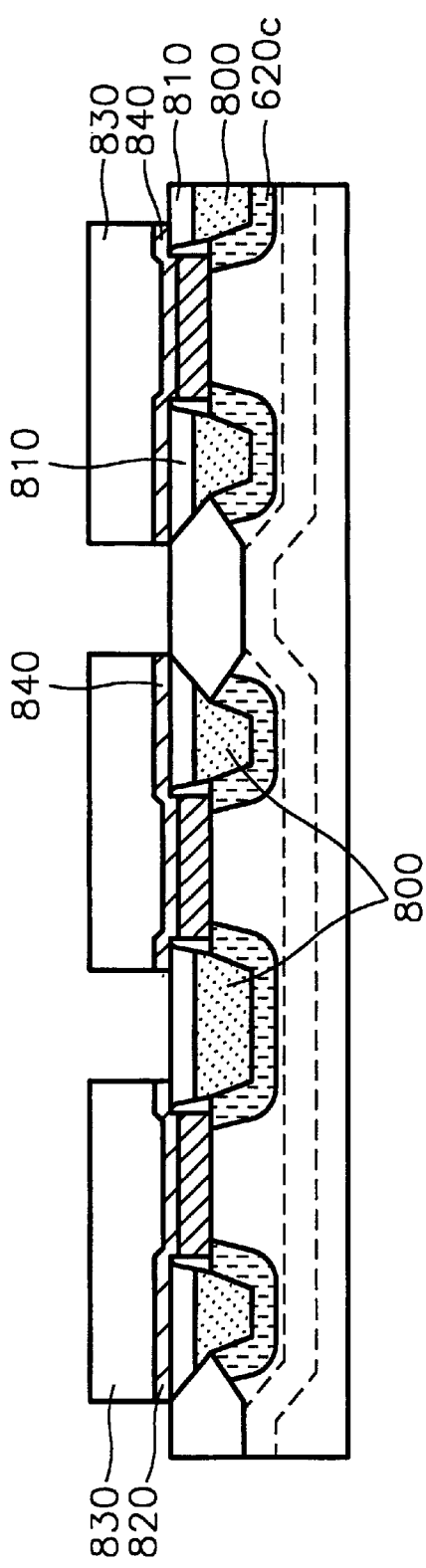

FIGS. 18A and 18B are cross-sectional views illustrating a fifth method aspect for forming a fifth embodiment of a nonvolatile memory circuit according to the present invention. In particular, FIGS. 18A and 18B are cross-sectional views taken along the line c–c' of FIG. 6.

According to the fifth method aspect, to fabricate a fifth embodiment of a nonvolatile memory circuit according to the present invention, the steps described in relation to the fourth method aspect up to the steps described in relation to FIGS. 16B and 17B are first performed. As illustrated in FIG. 18A, a conductive layer, preferably impurity-doped polysilicon, is deposited, and then dry-etched to form conductive regions 800 on the first, second and third source/drain regions 620a–c. According to the fifth embodiment, the source/drain regions 620a–c and the conductive regions 800 serve to reduce the resistance of the source and drain lines in the memory circuit. In addition, the barrier regions 210 and the insulation spacers 210 serve as etching stoppers for the etching to form the conductive regions 800. Preferably, the conductive regions 800 are wider than half the width of the trenches in which the corresponding source/drain regions are formed. Instead of doped polysilicon, a combination of a polysilicon layer and a tungsten silicide layer may be also be used to form the conductive regions 800. Upper portions of the conductive regions 800 are then oxidized to form insulation regions 810.

As illustrated in FIG. 18B, after removing the barrier regions 210 by wet-etching, a semiconductor layer, preferably polysilicon of a thickness of approximately 1000 Å, is deposited. The semiconductor layer is then patterned using a photoresist pattern 830 as an etching mask to form semiconductor regions 840. To complete fabrication, the steps described in relation to FIGS. 8G–K, 9G–K, 10G–K and 11G–11K for the first, second, third and fourth method aspects may then be performed.

Figure 19A:
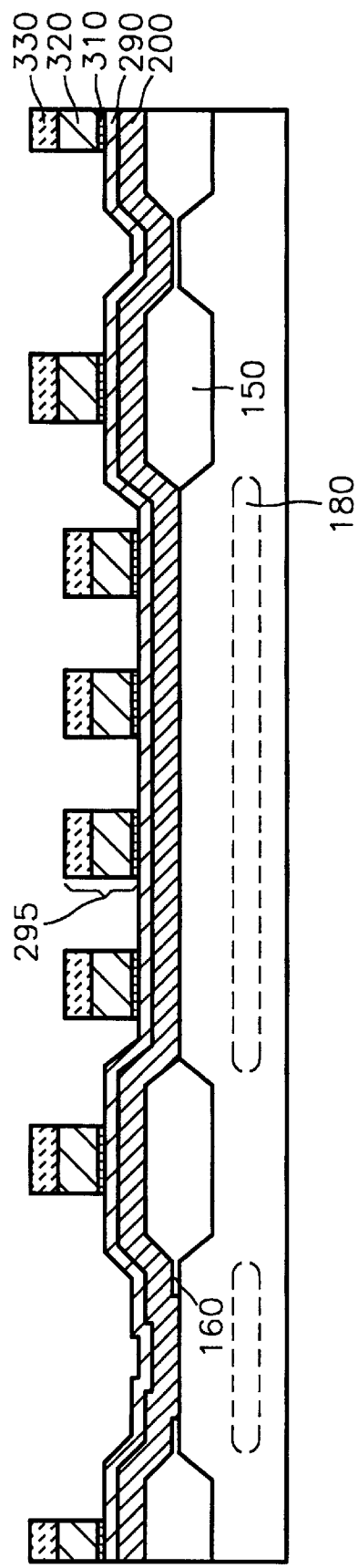
Figure 20A:
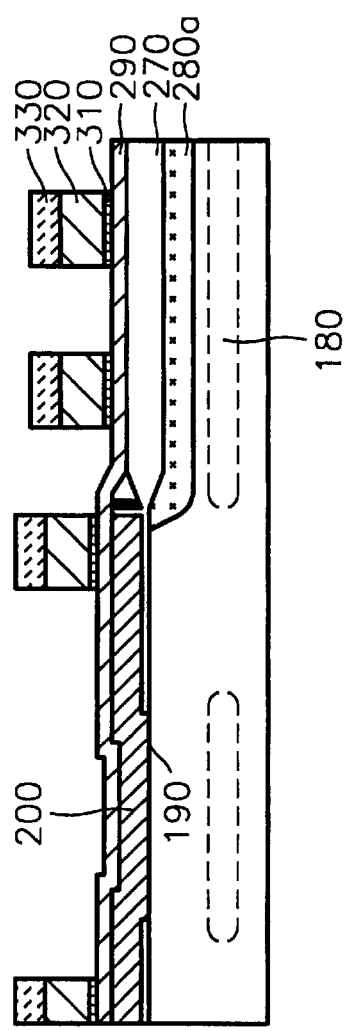

FIGS. 19A, 19B, 20A and 20B are cross-sectional views illustrating a sixth method aspect for forming a sixth embodiment of a nonvolatile memory circuit according to the present invention. In particular, FIGS. 19A and 19B are cross-sectional views taken along the line a–a' of FIG. 5, and FIGS. 20A and 20B are cross-sectional views taken along the line b–b' of FIG. 5.

According to the sixth method aspect, to fabricate a sixth embodiment of a nonvolatile memory circuit according to the present invention, the steps described in relation to the first method aspect up to the steps described in relation to FIGS. 8G, 9G, 10G and 11G are first performed. As illustrated in FIGS. 19A and 20A, a semiconductor layer, preferably polysilicon, and an insulation layer, preferably silicon dioxide, are etched using insulation regions 330 as an etching mask to form semiconductor regions 320 and insulation regions 310. As illustrated in FIGS. 19B and 20B, an insulation layer is deposited, preferably silicon dioxide of a thickness of approximately 1000–1500 Å, and then dry-etched to form insulation spacers 700 on sidewall portions of the insulation layer 330, the semiconductor regions 320 and the insulation regions 310. The underlying semiconductor regions 290, 200 are then dry-etched using the insulation layer 330 and the insulation spacers 700 as an etching mask, thereby completing string select line SSL, ground select line GSL, and word lines 295, and creating first and second rows of floating gate electrodes 285. To complete fabrication, the steps described in relation to FIGS. FIGS. 8I–K, 9I–K, 10I–K, and 11I–K for the first method aspect may be performed.

Referring now to FIG. 5, to erase memory cells M34 and M44, a voltage of approximately 18 V is applied to WL4, and a voltage of approximately 0 V is applied to non-selected word lines. A voltage of approximately 0 V is also applied to the bit lines BL3, BL4, while a voltage of approximately 5 V is applied to the string select line SSL, to apply a voltage of approximately 0 V to drain line 31. A voltage of approximately 0 V is applied to the ground select line GSL to turn off the ground select transistor T32, and float the source lines 33. This causes electrons to tunnel to the floating gate electrodes, thereby increasing threshold voltage of the cells to approximately 6–7 V.

To program a cell M34, a voltage of approximately –8 V is applied to word line WL4, while a voltage of approximately 0 V is applied to the nonselected word lines. A voltage of approximately 5 V is applied to bit line BL3, while a voltage of approximately 0 V is applied to non-selected bit lines. A voltage greater than 7 V is applied to the string select line SSL so that a voltage is applied to drain line 31 without a drop due to the threshold voltage of string select transistor T31. A voltage of approximately 0 V is applied to the ground select line GSL in order to float the source line 33. This causes tunneling of electrons from the floating gate electrode to the drain electrode of the memory cell, thereby lowering the threshold voltage of the memory cell to approximately 1–2 V.

To read from the programmed cell M34, a voltage of approximately 1 V is applied to the bit line BL3, a voltage of approximately 5 V is applied to the word line WL4, a voltage of approximately 0 V is applied to the source line 33, and a voltage of approximately 5 V is applied to the string select and ground select lines SSL, GSL to turn on the string select and ground select transistors T31, T32, thereby allowing current to flow through the cell M34. This current may then be detected to determine the state of the cell.

In the drawings and specification, there have been disclosed typical embodiments of the invention and, although specific terms are employed, they are used in a generic and descriptive sense only and not for purposes of limitation, the scope of the invention being set forth in the following claims.

That which is claimed is:

1. A dual-string NOR memory array comprising:

a substrate;

spaced apart first, second and third source/drain regions in said substrate, said third source/drain region disposed between said first and second source/drain regions, said first, second and third source/drain regions each having a generally elongate shape and first and second ends;

a first row of select transistors in said substrate, extending adjacent the first ends of said first, second and third source/drain regions;

a reference signal line on said substrate, extending adjacent the second ends of said first, second and third source/drain regions;

a first row of floating gate electrodes on said substrate, disposed between said first and third source/drain regions;

a second row of floating gate electrodes on said substrate, disposed between said second and third source/drain regions; and a plurality of insulated word lines on said substrate, a respective one of said insulated word lines overlying a respective one of said first row of floating gate electrodes and a respective one of said second row of floating gate electrodes and extending in a direction transverse to the first, second and third source/drain regions;

wherein an application of a word line voltage to the respective one of said insulated word lines can be used to establish a first inversion-layer channel in said substrate which extends opposite the respective one of said first row of floating gate electrodes and electrically connects the first and third source/drain regions together, and also establish a second inversion-layer channel in said substrate which extends opposite the respective one of said second row of floating gate electrodes and electrically connects the second and third source/drain regions together;

wherein the first ends of said first and second source/drain regions are electrically coupled to first and second select transistors in said first row thereof, respectively; and wherein the first end of said third source/drain region is terminated without a direct electrical connection to a select transistor in said first row thereof.

2. A memory circuit according to claim 1, further comprising:

a plurality of channel stop regions, a respective one of said plurality of channel stop regions being disposed between a respective pair of floating gate electrodes in a respective one of said first and second rows of floating gate electrodes.

3. A memory circuit according to claim 1, further comprising:

a fourth source/drain region in said substrate, adjacent and spaced apart from said first source/drain region, said fourth source/drain region comprising a source/drain region of a first select transistor in said first row thereof;

a fifth source/drain region in said substrate, adjacent and spaced apart from said second source/drain region, said fifth source/drain region comprising a source/drain region of a second select transistor in said first row thereof;

a first insulated gate of the first select transistor on said substrate disposed between said fourth source/drain region and said first source/drain region; and a second insulated gate of the second select transistor on said substrate disposed between said fifth source/drain region and said second source/drain region.

4. A memory circuit according to claim 3, further comprising:

a sixth source/drain region in said substrate, spaced apart from said third source/drain region and electrically connected to said reference signal line; and a third insulated gate on said substrate disposed between said sixth source/drain region and the second end of said third source/drain region.

5. A memory circuit according to claim 1, further comprising:

an impurity region in said substrate, underlying said first, second and third source/drain regions; and a field oxide region on said substrate, bordering portions of said first, second and third source/drain regions.

6. A memory circuit according to claim 1, wherein each of said floating gate electrodes comprises:

an insulation layer on the substrate;

a first semiconductor region on s aid insulation layer;

a second semiconductor region on said insulation layer.

7. A memory circuit according to claim 6, further comprising:

a sidewall insulating region adjacent sidewall portions of said first semiconductor region in each of said floating gate electrodes.

8. A memory circuit according to claim 7, wherein said sidewall insulating region comprises:

a silicon dioxide layer on sidewall portions of the first semiconductor region and on adjacent portions of the substrate;

a silicon nitride layer on the silicon dioxide layer; and a silicon dioxide spacer on the silicon nitride layer.

9. A memory circuit according to claim 7, wherein said sidewall insulating region comprises:

a silicon dioxide layer on sidewall portions of the first semiconductor region and on adjacent portions of the substrate; and a silicon nitride spacer on the silicon dioxide layer.

10. A memory circuit according to claim 1, wherein said first, second and third source/drain regions each comprise a trench in said substrate.

11. A memory circuit according to claim 10, further comprising a borophosphosilicate glass (BPSG) region on each of said first, second and third source/drain regions, in the associated trench.

12. A memory circuit according to claim 10, further comprising an elongate conductive region on each of said first, second and third source/drain regions, in the associated trench.

13. A dual-string NOR memory array, comprising:

a semiconductor substrate;

a reference signal line on said substrate;

a plurality of bit/data lines on said substrate;

first and second string select transistors in said substrate;

a first string of EEPROM cells having first drain regions electrically connected together and electrically coupled via said first string select transistor to a first of said plurality of bit/data lines;

a second string of EEPROM cells having second drain regions electrically connected together and electrically coupled via said second string select transistor to a second of said plurality of bit/data lines;

a source line in said substrate which comprises the source regions of said first and second strings of EEPROM cells, said source line having a first terminated end which is not electrically coupled to any of said plurality of bit/data lines, except indirectly through EEPROM cells in said first and second strings thereof, and a second end which can be electrically coupled to said reference signal line.

14. The memory array of claim 13, further comprising a ground select transistor having a source region in said source line and a drain region electrically connected to said reference signal line.

* * * * *